United States Patent
Katkar

(10) Patent No.: US 12,324,268 B2
(45) Date of Patent: *Jun. 3, 2025

(54) IMAGE SENSOR DEVICE

(71) Applicant: Adeia Semiconductor Technologies LLC, San Jose, CA (US)

(72) Inventor: Rajesh Katkar, Milpitas, CA (US)

(73) Assignee: Adeia Semiconductor Technologies LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/431,753

(22) Filed: Feb. 2, 2024

(65) Prior Publication Data

US 2024/0266377 A1 Aug. 8, 2024

Related U.S. Application Data

(60) Continuation of application No. 17/353,103, filed on Jun. 21, 2021, now Pat. No. 11,935,907, which is a
(Continued)

(51) Int. Cl.
*H10F 39/00* (2025.01)
*H01L 21/768* (2006.01)
(Continued)

(52) U.S. Cl.
CPC ..... *H10F 39/809* (2025.01); *H01L 21/76898* (2013.01); *H01L 23/481* (2013.01);
(Continued)

(58) Field of Classification Search
CPC ......... H01L 24/19; H01L 24/24; H01L 24/97; H01L 27/14634
See application file for complete search history.

(56) References Cited

U.S. PATENT DOCUMENTS 4,998,665 A 3/1991 Hayashi
5,019,673 A 5/1991 Juskey et al.
(Continued)

FOREIGN PATENT DOCUMENTS

CN 103681646 A 3/2014
EP 1011133 A1 6/2000
(Continued)

OTHER PUBLICATIONS

"Photo Etching DBC for Power Circuits—Direct Bond Copper (DBC) on Ceramic Used for Power Circuits," Conard Corporation, 2021, downloaded Nov. 9, 2021, https://www.conardcorp.com/photo-etching-dbc-for-power-circuits/, 2 pages.
(Continued)

*Primary Examiner* — Mark W Tornow
(74) *Attorney, Agent, or Firm* — Haley Guiliano LLP

(57) ABSTRACT

Methods of forming a back side image sensor device, as well as back side image sensor devices formed, are disclosed. In one such a method, an image sensor wafer having a first dielectric layer with a first surface is obtained. A reconstituted wafer having a processor die and a second dielectric layer with a second surface is obtained. The reconstituted wafer and the image sensor wafer are bonded to one another including coupling the first surface of the first dielectric layer and the second surface of the second dielectric layer. In another method, such formation is for a processor die bonded to an image sensor wafer. In yet another method, such formation is for a processor die bonded to an image sensor die.

29 Claims, 24 Drawing Sheets

Related U.S. Application Data continuation of application No. 16/513,489, filed on Jul. 16, 2019, now Pat. No. 11,069,734, which is a continuation-in-part of application No. 16/370,747, filed on Mar. 29, 2019, now Pat. No. 10,847,562, which is a continuation of application No. 15/875,067, filed on Jan. 19, 2018, now Pat. No. 10,269,853, which is a division of application No. 14/945,292, filed on Nov. 18, 2015, now Pat. No. 9,899,442.

(60) Provisional application No. 62/090,788, filed on Dec. 11, 2014.

(51) Int. Cl.
*H01L 23/00* (2006.01)
*H01L 23/48* (2006.01)
*H10F 39/12* (2025.01)

(52) U.S. Cl.
CPC ........... *H01L 24/18* (2013.01); *H10F 39/018* (2025.01); *H10F 39/026* (2025.01); *H10F 39/199* (2025.01); *H10F 39/804* (2025.01); *H10F 39/811* (2025.01); *H01L 2224/04105* (2013.01); *H01L 2224/12105* (2013.01); *H01L 2224/18* (2013.01); *H01L 2224/19* (2013.01); *H01L 2224/32145* (2013.01); *H01L 2224/73267* (2013.01); *H01L 2924/15153* (2013.01); *H01L 2924/16235* (2013.01)

(56) References Cited

U.S. PATENT DOCUMENTS

| | | |
|---|---|---|
| 5,051,802 A | 9/1991 | Prost et al. |
| 5,087,585 A | 2/1992 | Hayashi |
| 5,322,593 A | 6/1994 | Hasegawa et al. |
| 5,753,536 A | 5/1998 | Sugiyama et al. |
| 5,771,555 A | 6/1998 | Eda et al. |
| 5,854,507 A | 12/1998 | Miremadi et al. |
| 5,956,605 A | 9/1999 | Akram et al. |
| 5,985,739 A | 11/1999 | Plettner et al. |
| 5,998,808 A | 12/1999 | Matsushita |
| 6,008,126 A | 12/1999 | Leedy |
| 6,080,640 A | 6/2000 | Gardner et al. |
| 6,121,688 A | 9/2000 | Akagawa |
| 6,265,775 B1 | 7/2001 | Seyyedy |
| 6,374,770 B1 | 4/2002 | Lee et al. |
| 6,423,640 B1 | 7/2002 | Lee et al. |
| 6,465,892 B1 | 10/2002 | Suga |
| 6,582,991 B1 | 6/2003 | Maeda et al. |
| 6,768,208 B2 | 7/2004 | Lin et al. |
| 6,782,610 B1 | 8/2004 | Tijima et al. |
| 6,887,769 B2 | 5/2005 | Kellar et al. |
| 6,908,027 B2 | 6/2005 | Tolchinsky et al. |
| 7,045,453 B2 | 5/2006 | Canaperi et al. |
| 7,078,811 B2 | 7/2006 | Suga |
| 7,105,980 B2 | 9/2006 | Abbott et al. |
| 7,126,212 B2 | 10/2006 | Enquist et al. |
| 7,193,423 B1 | 3/2007 | Dalton et al. |
| 7,319,197 B2 | 1/2008 | Oggioni et al. |
| 7,354,798 B2 | 4/2008 | Pogge et al. |
| 7,554,203 B2 | 6/2009 | Zhou et al. |
| 7,582,971 B2 | 9/2009 | Kameyama et al. |
| 7,589,409 B2 | 9/2009 | Gibson et al. |
| 7,663,231 B2 | 2/2010 | Chang et al. |
| 7,750,488 B2 | 7/2010 | Chockalingam et al. |
| 7,759,751 B2 | 7/2010 | Ono |
| 7,786,572 B2 | 8/2010 | Chen |
| 7,803,693 B2 | 9/2010 | Trezza |
| 7,977,789 B2 | 7/2011 | Park |
| 8,049,303 B2 | 11/2011 | Osaka et al. |
| 8,064,224 B2 | 11/2011 | Mahajan et al. |
| 8,168,458 B2 | 5/2012 | Do et al. |
| 8,178,963 B2 | 5/2012 | Yang |
| 8,178,964 B2 | 5/2012 | Yang |
| 8,183,127 B2 | 5/2012 | Chockalingam et al. |
| 8,193,632 B2 | 6/2012 | Chang et al. |
| 8,227,904 B2 | 7/2012 | Braunisch et al. |
| 8,241,961 B2 | 8/2012 | Kim et al. |
| 8,263,434 B2 | 9/2012 | Pagaila et al. |
| 8,314,007 B2 | 11/2012 | Vaufredaz |
| 8,349,635 B1 | 1/2013 | Gan et al. |
| 8,377,798 B2 | 2/2013 | Peng et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,519,514 B2 | 8/2013 | Fujii |
| 8,524,533 B2 | 9/2013 | Tong et al. |
| 8,618,659 B2 | 12/2013 | Sato et al. |
| 8,620,164 B2 | 12/2013 | Heck et al. |
| 8,647,987 B2 | 2/2014 | Yang et al. |
| 8,691,601 B2 | 4/2014 | Izuha |
| 8,697,493 B2 | 4/2014 | Sadaka |
| 8,716,105 B2 | 5/2014 | Sadaka et al. |
| 8,791,575 B2 | 7/2014 | Oganesian et al. |
| 8,802,538 B1 | 8/2014 | Liu et al. |
| 8,809,123 B2 | 8/2014 | Liu et al. |
| 8,841,002 B2 | 9/2014 | Tong |
| 8,878,353 B2 | 11/2014 | Haba et al. |
| 8,901,748 B2 | 12/2014 | Manusharow et al. |
| 8,912,670 B2 | 12/2014 | Teh et al. |
| 8,975,726 B2 | 3/2015 | Chen et al. |
| 8,987,137 B2 | 3/2015 | Bachman et al. |
| 8,988,299 B2 | 3/2015 | Kam et al. |
| 9,093,350 B2 | 7/2015 | Endo et al. |
| 9,126,236 B2 | 9/2015 | Roos et al. |
| 9,136,293 B2 | 9/2015 | Yee et al. |
| 9,142,517 B2 | 9/2015 | Liu et al. |
| 9,153,552 B2 | 10/2015 | Teh et al. |
| 9,159,690 B2 | 10/2015 | Chiu et al. |
| 9,171,756 B2 | 10/2015 | Enquist et al. |
| 9,171,816 B2 | 10/2015 | Teh et al. |
| 9,184,125 B2 | 11/2015 | Enquist et al. |
| 9,190,380 B2 | 11/2015 | Teh et al. |
| 9,224,704 B2 | 12/2015 | Landru |
| 9,230,941 B2 | 1/2016 | Chen et al. |
| 9,252,172 B2 | 2/2016 | Chow et al. |
| 9,257,399 B2 | 2/2016 | Kuang et al. |
| 9,269,701 B2 | 2/2016 | Starkston et al. |
| 9,275,971 B2 | 3/2016 | Chiu et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,349,703 B2 | 5/2016 | Chiu et al. |
| 9,355,997 B2 | 5/2016 | Katkar et al. |
| 9,368,866 B2 | 6/2016 | Yu |
| 9,385,024 B2 | 7/2016 | Tong et al. |
| 9,394,161 B2 | 7/2016 | Cheng et al. |
| 9,437,572 B2 | 9/2016 | Chen et al. |
| 9,443,796 B2 | 9/2016 | Chou et al. |
| 9,443,824 B1 | 9/2016 | We et al. |
| 9,461,007 B2 | 10/2016 | Chun et al. |
| 9,466,586 B1 | 10/2016 | Choi et al. |
| 9,476,898 B2 | 10/2016 | Takano |
| 9,496,239 B1 | 11/2016 | Edelstein et al. |
| 9,536,848 B2 | 1/2017 | England et al. |
| 9,559,081 B1 | 1/2017 | Lai et al. |
| 9,601,353 B2 | 3/2017 | Huang et al. |
| 9,620,481 B2 | 4/2017 | Edelstein et al. |
| 9,627,365 B1 | 4/2017 | Yu et al. |
| 9,656,852 B2 | 5/2017 | Cheng et al. |
| 9,666,502 B2 | 5/2017 | Chen et al. |
| 9,666,559 B2 | 5/2017 | Wang et al. |
| 9,722,098 B1 | 8/2017 | Chung et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,881,882 B2 | 1/2018 | Hsu et al. |

(56) References Cited

U.S. PATENT DOCUMENTS

| | | |
|---|---|---|
| 9,893,004 B2 | 2/2018 | Yazdani |
| 9,899,442 B2 * | 2/2018 | Katkar ............... H01L 24/32 |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 9,966,360 B2 | 5/2018 | Yu et al. |
| 10,008,844 B2 | 6/2018 | Lückemeier |
| 10,026,605 B2 | 7/2018 | Doub et al. |
| 10,032,722 B2 | 7/2018 | Yu et al. |
| 10,075,657 B2 | 9/2018 | Fahim et al. |
| 10,204,893 B2 | 2/2019 | Uzoh et al. |
| 10,269,756 B2 | 4/2019 | Uzoh |
| 10,269,853 B2 | 4/2019 | Katkar |
| 10,276,619 B2 | 4/2019 | Kao et al. |
| 10,276,909 B2 | 4/2019 | Huang et al. |
| 10,446,456 B2 | 10/2019 | Shen et al. |
| 10,727,219 B2 | 7/2020 | Uzoh et al. |
| 10,847,562 B2 | 11/2020 | Katkar |
| 11,056,390 B2 | 7/2021 | Uzoh et al. |
| 11,069,734 B2 | 7/2021 | Katkar |
| 11,935,907 B2 * | 3/2024 | Katkar ............... H01L 24/11 |
| 2002/0000328 A1 | 1/2002 | Motomura et al. |
| 2002/0003307 A1 | 1/2002 | Suga |
| 2002/0004288 A1 | 1/2002 | Nishiyama |
| 2002/0074668 A1 | 6/2002 | Hofstee et al. |
| 2004/0084414 A1 | 5/2004 | Sakai et al. |
| 2004/0238927 A1 | 12/2004 | Miyazawa |
| 2005/0040530 A1 | 2/2005 | Shi |
| 2005/0153522 A1 | 7/2005 | Hwang et al. |
| 2005/0218518 A1 | 10/2005 | Jiang et al. |
| 2006/0057945 A1 | 3/2006 | Hsu et al. |
| 2006/0087042 A1 | 4/2006 | Kameyama et al. |
| 2006/0278331 A1 | 12/2006 | Dugas et al. |
| 2007/0080442 A1 | 4/2007 | Meyer-Berg |
| 2007/0096294 A1 | 5/2007 | Ikeda et al. |
| 2007/0111386 A1 | 5/2007 | Kim et al. |
| 2007/0158024 A1 | 7/2007 | Addison et al. |
| 2007/0158827 A1 | 7/2007 | Schuster |
| 2007/0222048 A1 | 9/2007 | Huang |
| 2007/0295456 A1 | 12/2007 | Gudeman et al. |
| 2008/0079105 A1 | 4/2008 | Chang et al. |
| 2008/0211045 A1 | 9/2008 | Ono |
| 2008/0231311 A1 | 9/2008 | Condorelli et al. |
| 2008/0265421 A1 | 10/2008 | Brunnbauer et al. |
| 2008/0308928 A1 * | 12/2008 | Chang ............... H01L 27/14618 257/723 |
| 2009/0068831 A1 | 3/2009 | Enquist et al. |
| 2009/0149023 A1 | 6/2009 | Koyanagi |
| 2009/0227089 A1 | 9/2009 | Plaut et al. |
| 2009/0252939 A1 | 10/2009 | Park et al. |
| 2009/0283898 A1 | 11/2009 | Janzen et al. |
| 2009/0321939 A1 | 12/2009 | Chandrasekaran |
| 2010/0123268 A1 | 5/2010 | Menard |
| 2010/0167534 A1 | 7/2010 | Iwata |
| 2010/0327424 A1 | 12/2010 | Braunisch et al. |
| 2011/0074033 A1 | 3/2011 | Kaltalioglu et al. |
| 2011/0290552 A1 | 12/2011 | Palmateer et al. |
| 2012/0018868 A1 | 1/2012 | Oganesian et al. |
| 2012/0074585 A1 | 3/2012 | Koo et al. |
| 2012/0187516 A1 | 7/2012 | Sato |
| 2012/0194719 A1 | 8/2012 | Churchwell et al. |
| 2012/0199960 A1 | 8/2012 | Cosue et al. |
| 2012/0212384 A1 | 8/2012 | Kam et al. |
| 2012/0306038 A1 | 12/2012 | Chow et al. |
| 2013/0037962 A1 | 2/2013 | Xue |
| 2013/0122655 A1 | 5/2013 | Yu et al. |
| 2013/0265733 A1 | 10/2013 | Herbsommer et al. |
| 2013/0299997 A1 | 11/2013 | Sadaka et al. |
| 2014/0013606 A1 | 1/2014 | Nah et al. |
| 2014/0070348 A1 | 3/2014 | Yee et al. |
| 2014/0154839 A1 | 6/2014 | Ahn et al. |
| 2014/0175655 A1 | 6/2014 | Chen et al. |
| 2014/0225795 A1 | 8/2014 | Yu |
| 2014/0299981 A1 | 10/2014 | Goh et al. |
| 2014/0312511 A1 | 10/2014 | Nakamura et al. |
| 2014/0370658 A1 | 12/2014 | Tong et al. |
| 2015/0021754 A1 | 1/2015 | Lin et al. |
| 2015/0064498 A1 | 3/2015 | Tong |
| 2015/0102468 A1 | 4/2015 | Kang et al. |
| 2015/0179481 A1 | 6/2015 | Lin |
| 2015/0194406 A1 | 7/2015 | Teh et al. |
| 2015/0340285 A1 | 11/2015 | Enquist et al. |
| 2016/0172402 A1 | 6/2016 | Katkar |
| 2016/0300813 A1 | 10/2016 | Zhai et al. |
| 2016/0300817 A1 | 10/2016 | Do et al. |
| 2016/0329284 A1 | 11/2016 | We et al. |
| 2016/0343682 A1 | 11/2016 | Kawasaki |
| 2016/0343685 A1 | 11/2016 | Lin et al. |
| 2017/0062366 A1 | 3/2017 | Enquist |
| 2017/0125379 A1 | 5/2017 | Chen et al. |
| 2017/0148764 A1 | 5/2017 | Wang et al. |
| 2017/0179029 A1 | 6/2017 | Enquist et al. |
| 2017/0179078 A1 | 6/2017 | Jung et al. |
| 2017/0194271 A1 | 7/2017 | Hsu et al. |
| 2017/0200711 A1 | 7/2017 | Uzoh et al. |
| 2017/0338214 A1 | 11/2017 | Uzoh et al. |
| 2017/0365580 A1 | 12/2017 | Shih et al. |
| 2018/0005984 A1 | 1/2018 | Yu et al. |
| 2018/0012787 A1 | 1/2018 | Oka et al. |
| 2018/0026008 A1 | 1/2018 | Jeng et al. |
| 2018/0053746 A1 | 2/2018 | Yu et al. |
| 2018/0096931 A1 | 4/2018 | Huang et al. |
| 2018/0122774 A1 | 5/2018 | Huang et al. |
| 2018/0130769 A1 | 5/2018 | Tan et al. |
| 2018/0145105 A1 | 5/2018 | Katkar |
| 2018/0174995 A1 | 6/2018 | Wang et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | Delacruz et al. |
| 2018/0191047 A1 | 7/2018 | Huang et al. |
| 2018/0219038 A1 | 8/2018 | Gambino et al. |
| 2018/0226375 A1 | 8/2018 | Enquist et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0366442 A1 | 12/2018 | Gu et al. |
| 2018/0366446 A1 | 12/2018 | Haba et al. |
| 2019/0096741 A1 | 3/2019 | Uzoh et al. |
| 2019/0096842 A1 | 3/2019 | Fountain et al. |
| 2019/0115277 A1 | 4/2019 | Yu et al. |
| 2019/0131277 A1 | 5/2019 | Yang et al. |
| 2019/0198407 A1 | 6/2019 | Huang et al. |
| 2019/0198409 A1 | 6/2019 | Katkar et al. |
| 2019/0229142 A1 | 7/2019 | Katkar |
| 2019/0265411 A1 | 8/2019 | Huang et al. |
| 2019/0333550 A1 | 10/2019 | Fisch |
| 2019/0333871 A1 | 10/2019 | Chen et al. |
| 2019/0348336 A1 | 11/2019 | Katkar et al. |
| 2019/0348459 A1 | 11/2019 | Katkar |
| 2019/0371763 A1 | 12/2019 | Agarwal et al. |
| 2019/0385966 A1 | 12/2019 | Gao et al. |
| 2020/0013637 A1 | 1/2020 | Haba |
| 2020/0013765 A1 | 1/2020 | Fountain et al. |
| 2020/0075534 A1 | 3/2020 | Gao et al. |
| 2020/0118973 A1 | 4/2020 | Wang et al. |
| 2020/0126906 A1 | 4/2020 | Uzoh et al. |
| 2020/0176419 A1 | 6/2020 | Dabral et al. |
| 2020/0194396 A1 | 6/2020 | Uzoh |
| 2020/0227367 A1 | 7/2020 | Haba et al. |
| 2020/0294908 A1 | 9/2020 | Haba et al. |
| 2020/0328162 A1 | 10/2020 | Haba et al. |
| 2020/0328164 A1 | 10/2020 | Delacruz et al. |
| 2020/0328165 A1 | 10/2020 | Delacruz et al. |
| 2020/0371154 A1 | 11/2020 | Delacruz et al. |
| 2020/0395321 A1 | 12/2020 | Katkar et al. |
| 2021/0098412 A1 | 4/2021 | Haba et al. |
| 2021/0181510 A1 | 6/2021 | Katkar et al. |
| 2021/0183847 A1 | 6/2021 | Uzoh et al. |

(56) References Cited

U.S. PATENT DOCUMENTS

| | | |
|---|---|---|
| 2021/0193603 A1 | 6/2021 | Delacruz et al. |
| 2021/0193625 A1 | 6/2021 | Katkar et al. |
| 2021/0242152 A1 | 8/2021 | Fountain et al. |
| 2021/0296282 A1 | 9/2021 | Gao et al. |
| 2021/0366970 A1 | 11/2021 | Katkar |
| 2024/0178256 A1 | 5/2024 | Katkar |

FOREIGN PATENT DOCUMENTS

| | | | |
|---|---|---|---|
| EP | 2685491 | A2 | 1/2014 |
| JP | 04-337694 | A | 11/1992 |
| JP | 2000100679 | A | 4/2000 |
| JP | 2000236044 | A | 8/2000 |
| JP | 2001102479 | A | 4/2001 |
| JP | 2001284520 | A | 10/2001 |
| JP | 2002353416 | A | 12/2002 |
| JP | 2002359345 | A | 12/2002 |
| JP | 2004193493 | A | 7/2004 |
| JP | 2008-112101 | A | 5/2008 |
| JP | 2008130603 | A | 6/2008 |
| JP | 4337694 | B2 | 7/2009 |
| JP | 2011171614 | A | 9/2011 |
| JP | 2013-033786 | A | 2/2013 |
| JP | 2018160519 | A | 10/2018 |
| KR | 2001-0104643 | A | 11/2001 |
| KR | 20100123755 | A | 11/2010 |
| KR | 20110104643 | A | 9/2011 |
| KR | 20140032856 | A | 3/2014 |
| KR | 20150097798 | A | 8/2015 |
| WO | 2005/043584 | A2 | 5/2005 |
| WO | 2006100444 | A1 | 9/2006 |
| WO | 2008/112101 | A2 | 9/2008 |
| WO | 2010024678 | A1 | 3/2010 |
| WO | 2017034654 | A1 | 3/2017 |
| WO | 2017052652 | A1 | 3/2017 |
| WO | 2017151442 | A1 | 9/2017 |

OTHER PUBLICATIONS

Amirfeiz et al., "Formation of silicon structures by plasma-activated wafer bonding," Journal of The Electrochemical Society, 2000, vol. 147, No. 7, pp. 2693-2698.
Braunisch, H. et al., "High-speed performance of silicon bridge die-to-die interconnects," 2011 IEEE, pp. 95-98.
Ceramic Microstructures: Control at the Atomic Level, Recent Progress in Surface Activated Bonding, 1998, pp. 385-389.
Chung et al., "Wafer direct bonding of compound semiconductors and silicon at room temperature by the surface activated bonding method," Applied Surface Science, Jun. 2, 1997, vols. 117-118, pp. 808-812.
Farrens et al., "Chemical free room temperature wafer to wafer direct bonding," J. Electrochem. Soc., The Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.
Frumusanu, Andrei, "TSMC's version of EMIB is 'LSI': Currently in pre-qualification," AnaandTech, https://www.anandtech.com/show/16031/tsmcs-version-of-emib-lsi-3dfabric, Aug. 25, 2020, 6 pages.
Fukushima, T. et al., "New three-dimensional integration technology using self-assembly technique," International Electron Devices Meeting 5-7.12.2005, IEEE, Dec. 5, 2005, pp. 348-351.
Gosele et al., "Semiconductor Wafer Bonding: A flexible approach to materials combinations in microelectronics; micromechanics and optoelectronics," IEEE, 1997, pp. 23-32.
Hosoda et al., "Effect of the surface treatment on the room-temperature bonding of Al to Si and SiO2" Journal of Materials Science, Jan. 1, 1998, vol. 33, Issue 1, pp. 253-258.
Hosoda et al., "Room temperature GaAs—Si and InP—Si wafer direct bonding by the surface activated bonding method," Nuclear Inst. And Methods in Physics Research B, 1997, vol. 121, Nos. 1-4, pp. 203-206.

Howlader et al., "A novel method for bonding of ionic wafers," Electronics Components and Technology Conference, 2006, IEEE, pp. 7-pp.
Howlader et al., "Bonding of p-Si/n-InP wafers through surface activated bonding method at room temperature," Indium Phosphide and Related Materials, 2001, IEEE International Conference On, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
International Search Report and Written Opinion mailed Apr. 22, 2019 in International Application No. PCT/US2018/064982, 13 pages.
International Search Report and Written Opinion mailed Oct. 25, 2019, issued in International Application No. PCT/US2019/040622, 12 pages.
International Search Report mailed Feb. 23, 2016 for International Application No. PCT/US2015/063239, 16 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Ker, Ming-Dou et al., "Fully process-compatible layout design on bond pad to improve wire bond reliability in CMOS lcs," IEEE Transactions on Components and Packaging Technologies, Jun. 2002, vol. 25, No. 2, pp. 309-316.
Kim et al., "Low temperature direct Cu—Cu bonding with low energy ion activation method," Electronic Materials and Packaging, 2001, IEEE, pp. 193-195.
Kim et al., "Room temperature Cu-Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—CU, Cu—Si, and Cu—SiO2 at low temperature," Proceedings—Electrochemical Society, 2003, vol. 19, pp. 239-247.
Matsuzawa et al., "Room-temperature interconnection of electroplated Au microbump by means of surface activated bonding method," Electronic Components and Technology Conference, 2001, 51st Proceedings, IEEE, pp. 384-387.
Moriceau, H. et al., "Overview of recent direct wafer bonding advances and applications," Advances in Natural Sciences-Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
NASA SBIR/STTR Technologies, Proposal No. 09-1 S5.05-9060—Reliable Direct Bond Copper Ceramic Packages for High Temperature Power Electronics, Contract No. NNX10CE23P, PI: Ender Savrun, PhD, Sienna Technologies, Inc.—Woodinville, WA, 1 page.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(I), 6 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behavior," Electrochemical Society Proceedings, 1998, vol. 97-36, pp. 437-444.

(56) References Cited

OTHER PUBLICATIONS

Roberds et al., "Low temperature , in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP—Cu film for bumpless interconnection," Electronic Components and Technology Conference, 51st Proceedings, 2001, IEEE, pp. 755-760.
Shingo et al., "Design and fabrication of an electrostatically actuated MEMS probe card," Transducers, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Takagi et al., "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room temperature silicon wafer direct bonding in vacuum by Ar beam irradiation," Micro Electro Mechanical Systems, MEMS '97 Proceedings, 1997, IEEE, pp. 191-196.
Takagi et al., "Room-temperature bonding of lithium niobate and silicon wafers by argon- beam surface activation," Appl. Phys. Lett., 1999. vol. 74, pp. 2387.

Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectromechanical systems, Mar. 1994, vol. 3, No. 1, pp. 29-35.
Topol et al., "Enabling technologies for wafer-level bonding of 3D MEMS and integrated circuit structures," 2004 Electronics Components and Technology Conference, 2004 IEEE, pp. 931-938.
Uhrmann, T. et al., "Heterogeneous integration by collective die-to-wafer bonding," Chip Scale Review, Nov./Dec. 2018, vol. 22, No. 6, pp. 10-12.
Urteaga, M. et al., "THz bandwidth InP HBT technologies and heterogeneous integration with Si CMOS," 2016 IEEE Bipolar/BiCMOS Circuits and Technology Meeting (BCTM), 2016, pp. 35-41, doi: 10.1109/BCTM.2016.7738973.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Xu et al., "New Au—Al interconnect technology and its reliability by surface activated bonding," Electronic Packaging Technology Proceedings, Oct. 28-30, 2003, Shanghai, China, pp. 479-483.
Chung , et al. , "Room temperature GaAseu + Si and InPeu + Si wafer direct bonding by the surface activate bonding method" , Nuclear Instruments and Methods in Physics Research Section B: Beam Interactions with Materials and Atoms, Jan. 2, 1997, vol. 121, Issues 1-4, pp. 203-206.
Itoh , et al. , "Development of Mems Ic probe card utilizing fritting contact", Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Suga, T. , et al. , "Feasibility of surface activated bonding for ultra-fine pitch interconnection—A new concept of bump-less direct bonding for system level packaging" , The University of Tokyo, Research Center for Science and Technology, 2000 Electronic Components and Technology Conference, 2000 IEEE, pp. 702-705.
International Preliminary Report on Patentability received for PCT Patent Application No. PCT/US15/63239, mailed on Jun. 22, 2017, 11 pages.

\* cited by examiner

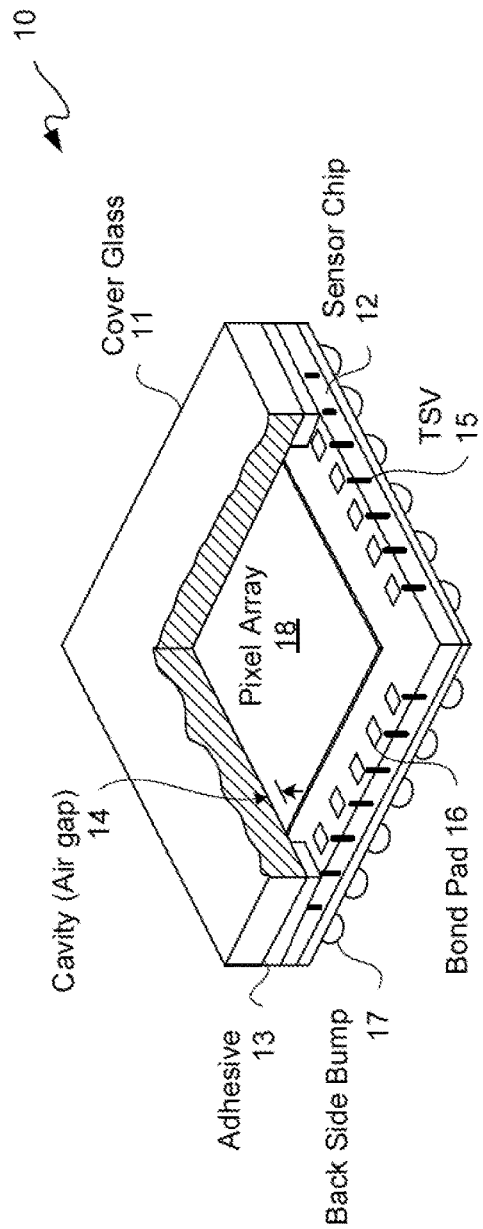
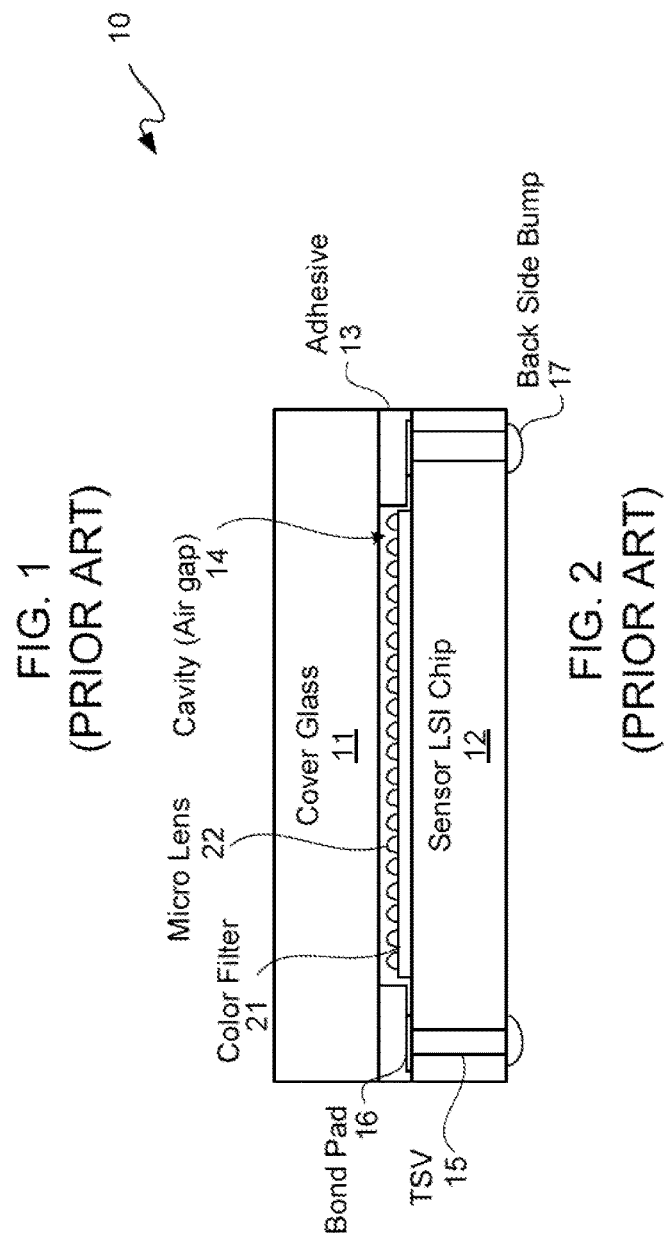
FIG. 1 (PRIOR ART)
FIG. 2 (PRIOR ART)

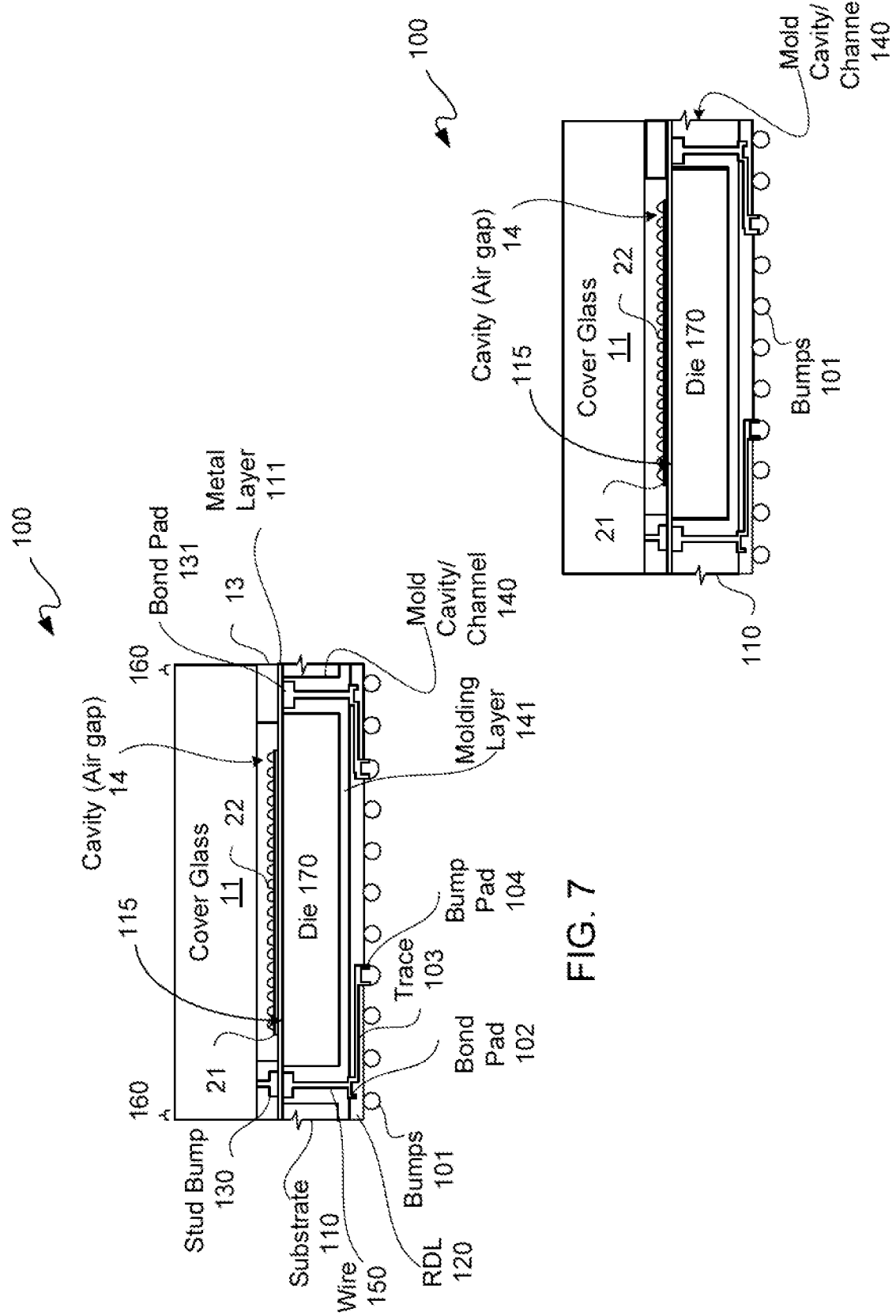

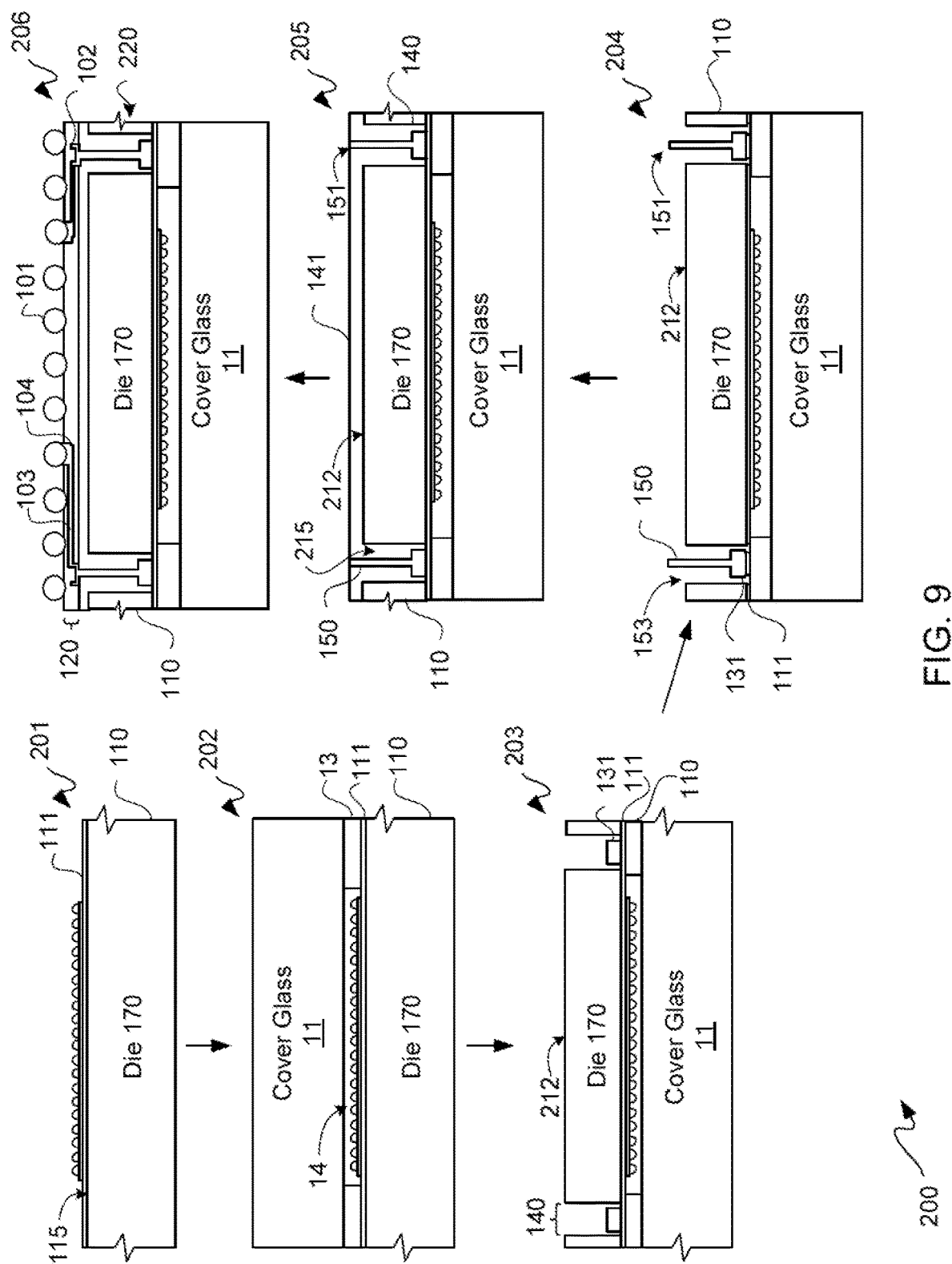

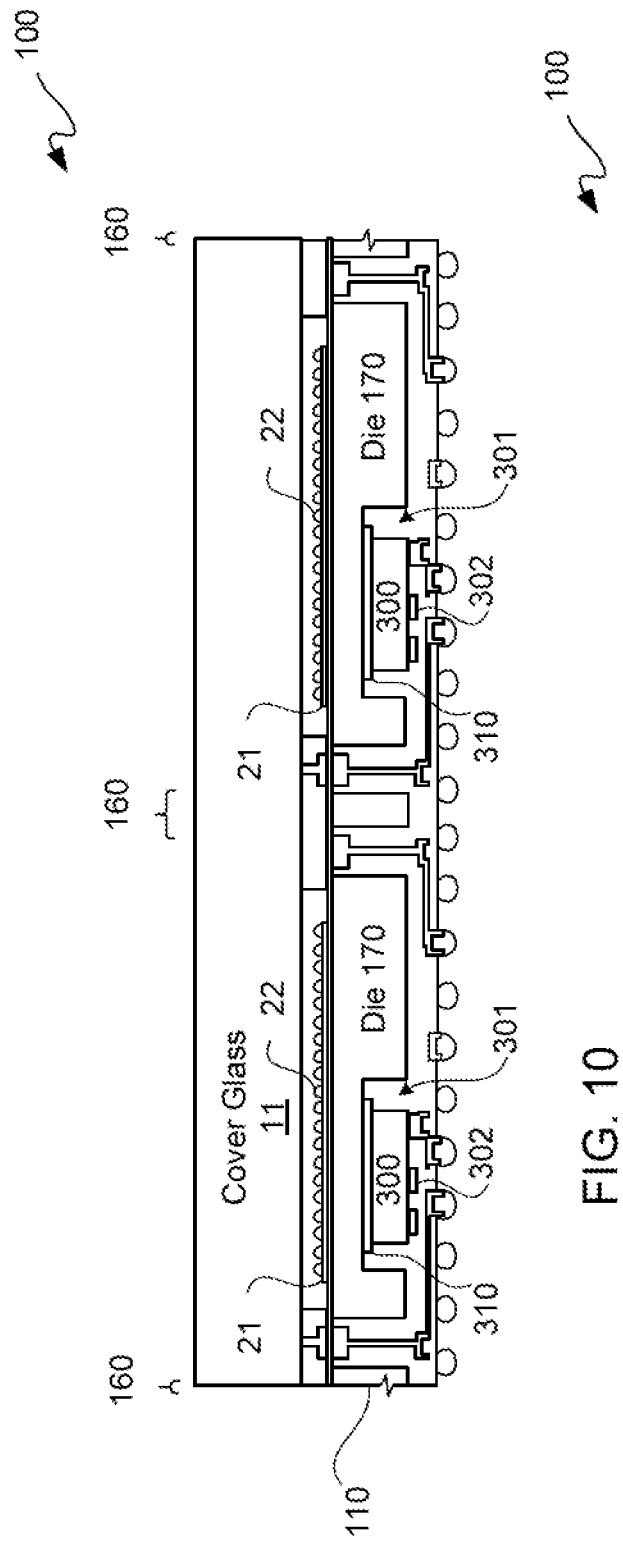
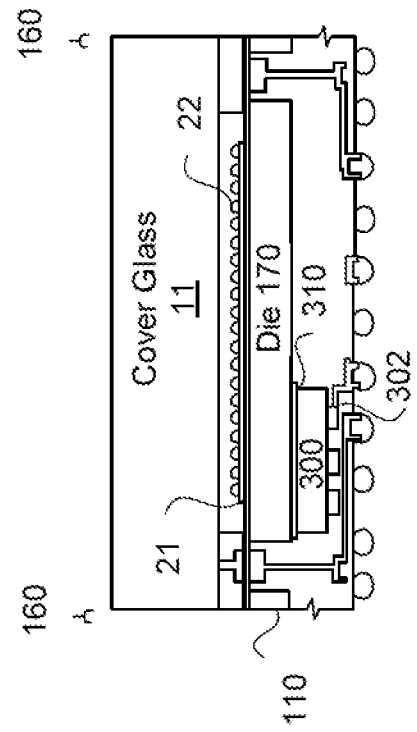
FIG. 10
FIG. 11

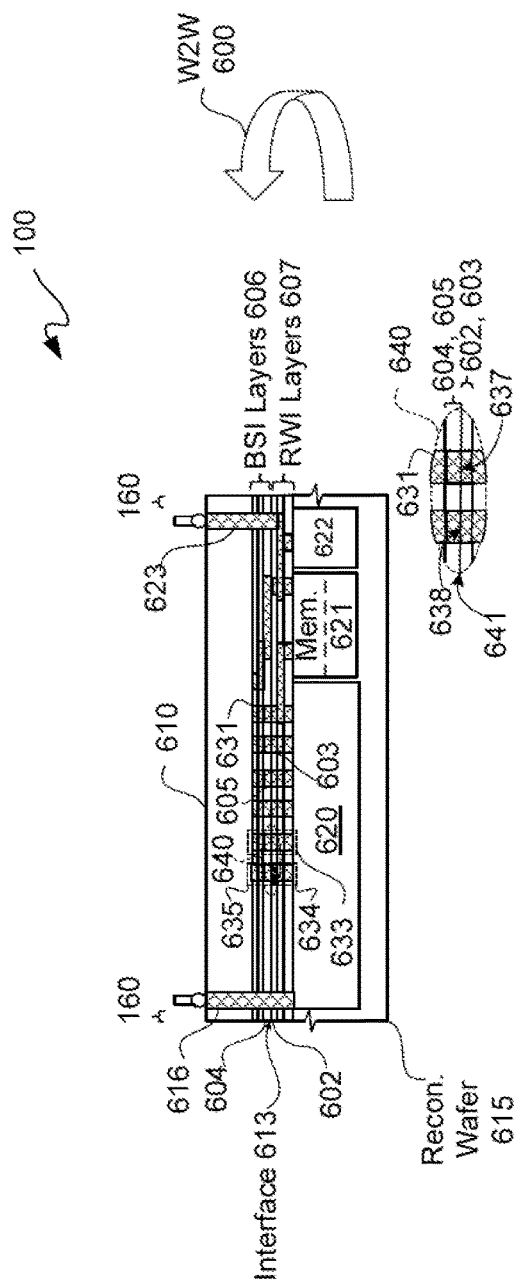
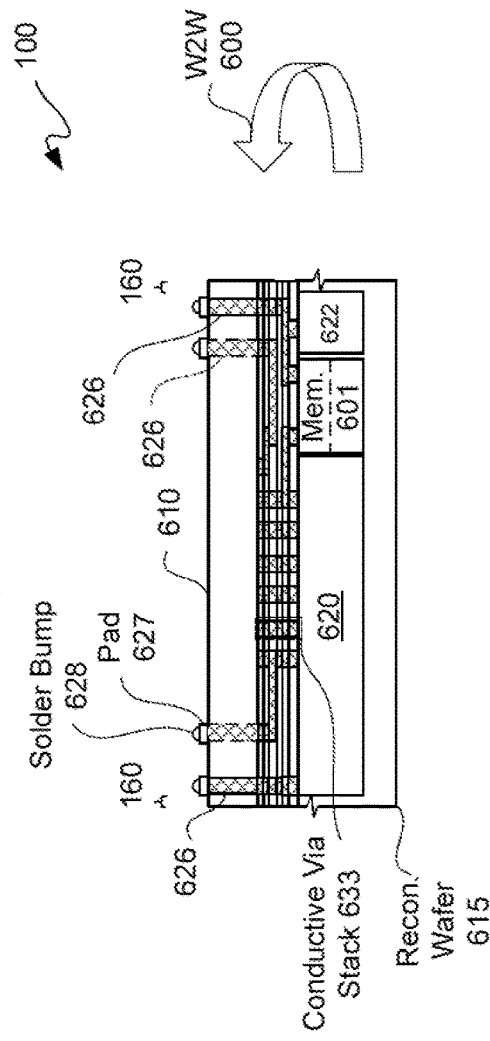
FIG. 17-3
FIG. 17-4

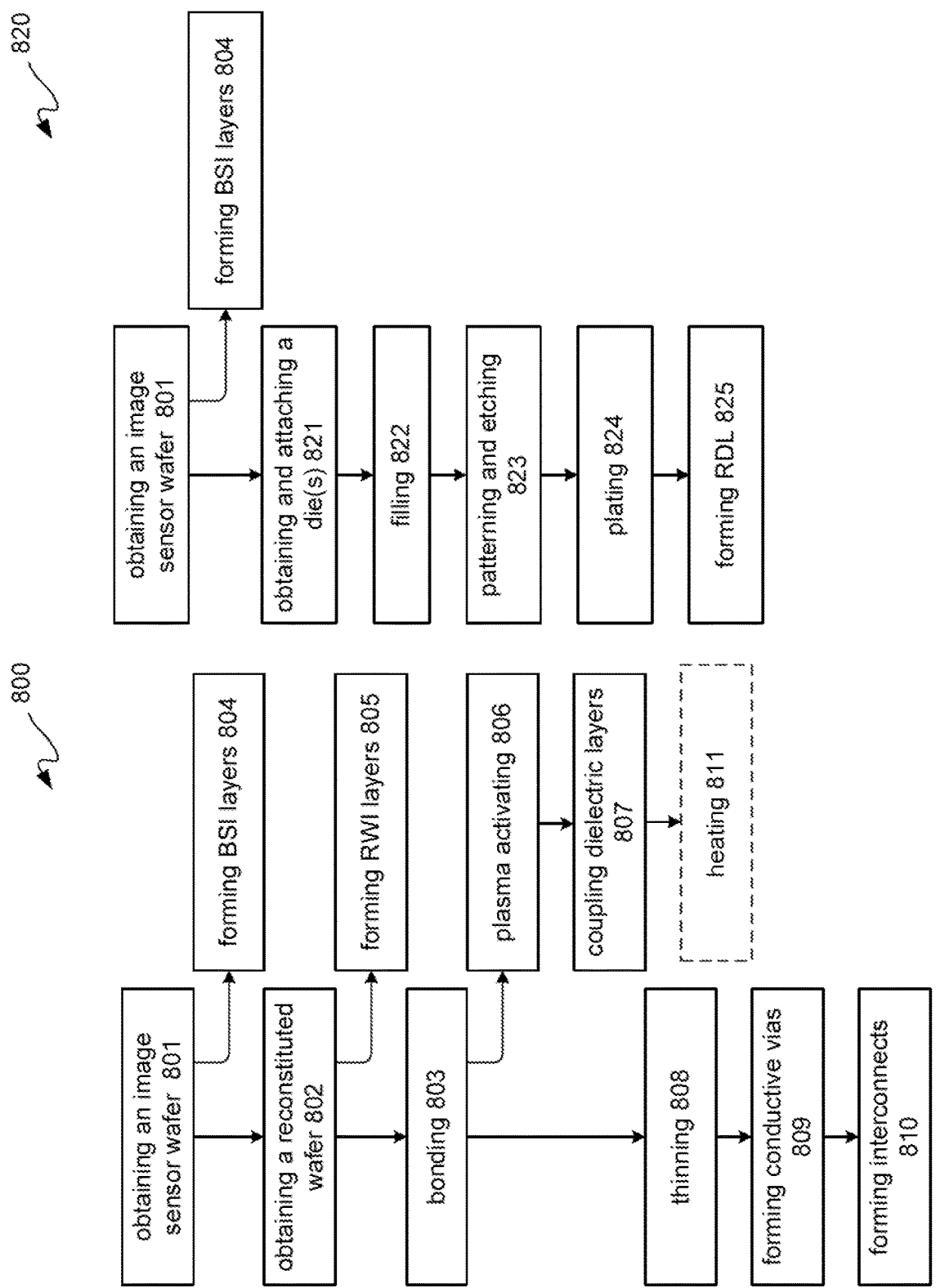

IMAGE SENSOR DEVICE

CROSS-REFERENCE TO RELATED APPLICATION(S)

This application is a continuation of U.S. patent application Ser. No. 17/353,103, filed Jun. 21, 2021, which is a continuation of U.S. patent application Ser. No. 16/513,489, filed Jul. 16, 2019 (now U.S. Pat. No. 11,069,734), which is a continuation-in-part of U.S. patent application Ser. No. 16/370,747, filed Mar. 29, 2019 (now U.S. Pat. No. 10,847,562), which is a continuation of U.S. patent application Ser. No. 15/875,067 (now U.S. Pat. No. 10,269,853), filed Jan. 19, 2018, which is a a divisional of U.S. patent application Ser. No. 14/945,292 (now U.S. Pat. No. 9,899,442), filed Nov. 18, 2015, which claims priority to U.S. Provisional Application No. 62/090,788, filed Dec. 11, 2014. The disclosures of which are hereby incorporated by reference herein in their entireties.

FIELD

The following description relates to integrated circuits ("ICs"). More particularly, the following description relates to an image sensor device.

BACKGROUND

Microelectronic assemblies generally include one or more ICs, such as for example one or more packaged dies ("chips") or one or more dies. One or more of such ICs may be mounted on a circuit platform, such as a wafer such as in wafer-level-packaging ("WLP"), printed board ("PB"), a printed wiring board ("PWB"), a printed circuit board ("PCB"), a printed wiring assembly ("PWA"), a printed circuit assembly ("PCA"), a package substrate, an interposer, or a chip carrier. Additionally, one IC may be mounted on another IC. An interposer may be an IC, and an interposer may be a passive or an active IC, where the latter includes one or more active devices, such as transistors for example, and the former does not include any active device. Furthermore, an interposer may be formed like a PWB, namely without any circuit elements, such as passive devices including inductors, capacitors and resistors, or active devices. Additionally, an interposer includes at least one through-substrate-via.

An IC may include conductive elements, such as pathways, traces, tracks, vias, contacts, pads such as contact pads and bond pads, plugs, nodes, or terminals for example, that may be used for making electrical interconnections with a circuit platform. These arrangements may facilitate electrical connections used to provide functionality of ICs. An IC may be coupled to a circuit platform by bonding, such as bonding traces or terminals, for example, of such circuit platform to bond pads or exposed ends of pins or posts or the like of an IC. Additionally, a redistribution layer ("RDL") may be part of an IC to facilitate a flip-chip configuration, a die stacking configuration, or a more convenient or accessible position of bond pads for example.

Conventionally, an image sensor device, such as for a digital camera, is coupled to a separate controller chip ("controller"), such as to control sensor sensing time (exposure time), thresholds, and/or other features. An image sensor device may further be coupled to a separate driver chip and a separate image processor chip, as is known. Such controller may further be coupled to a motor for adjusting focus and/or electronic aperture, among other camera components. Distance between an image sensor device and a separate chip coupled thereto, such as a controller or image sensor for example, of a camera causes an amount of signal propagation delay. This delay can negatively impact performance of a camera.

Accordingly, it would be desirable and useful to provide a camera with less propagation time between an image sensor device and a separate chip coupled thereto.

BRIEF SUMMARY

A method relates generally to formation of a back side image sensor device. In such a method, an image sensor wafer having a first dielectric layer with a first surface is obtained. A reconstituted wafer having a processor die and a second dielectric layer with a second surface is obtained. The reconstituted wafer and the image sensor wafer are bonded to one another including coupling the first surface of the first dielectric layer and the second surface of the second dielectric layer.

Another method relates generally to formation of a back side image sensor device. In such a method, an image sensor wafer having a first dielectric layer with a first surface is obtained. A processor die having a second dielectric layer with a second surface is obtained. The first dielectric layer includes a first plurality of metallic pads of a first metal layer. The second dielectric layer includes a second plurality of metallic pads of a second metal layer. The processor die and the image sensor wafer are bonded to one another including coupling the first surface of the first dielectric layer and the second surface of the second dielectric layer to one another. The coupling includes interconnecting first surfaces of the first plurality of metallic pads of the first surface and second surfaces of the second plurality of metallic pads of the second surface directly to one another for electrical connectivity.

Yet another method relates generally to formation of a back side image sensor device. In such a method, an image sensor wafer having a first dielectric layer with a first surface is obtained. A processor die having a second dielectric layer with a second surface is obtained. The first dielectric layer includes a first plurality of metallic pads of a first metal layer. The second dielectric layer includes a second plurality of metallic pads of a second metal layer. The processor die has a third surface opposite the second surface. The processor die and the image sensor wafer are bonded to one another including coupling the first surface of the first dielectric layer of the image sensor wafer and the third surface of the processor die.

Still yet another method relates generally to formation of a back side image sensor device. In such a method, an image sensor die having a first dielectric layer with a first surface is obtained. A processor die having a second dielectric layer with a second surface is obtained. The first dielectric layer includes a first plurality of metallic pads of a first metal layer. The second dielectric layer includes a second plurality of metallic pads of a second metal layer. The processor die and the image sensor die are bonded to one another including coupling the first surface of the first dielectric layer and the second surface of the second dielectric layer to one another. The coupling includes interconnecting first surfaces of the first plurality of metallic pads of the first surface and second surfaces of the second plurality of metallic pads of the second surface directly to one another for electrical connectivity.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

FIG. 1 is a top-down perspective and cut-away view illustratively depicting an exemplary conventional image sensor device.

FIG. 2 is a cross-sectional side view illustratively depicting an exemplary the conventional image sensor device of FIG. 1.

FIG. 7 is a cross-sectional side view illustratively depicting an exemplary image sensor device with dicing lanes for sensor dies in a substrate.

FIG. 8 is a cross-sectional side view illustratively depicting an exemplary image sensor device with dicing lanes in mold cavities.

FIG. 9 is a progression of cross-sectional side views illustratively depicting an exemplary process flow, which may be used to form the image sensor device of FIG. 7.

FIG. 10 is a cross-sectional side view illustratively depicting an exemplary image sensor device with dicing lanes for an image sensor die in a substrate and with an optional embedded die.

FIG. 11 is a cross-sectional side view illustratively depicting another exemplary image sensor device with dicing lanes for an image sensor die in a substrate and with an optional embedded die.

FIGS. 17-1 through 17-9 are respective cross-sectional side views illustratively depicting examples of a "back side" image sensor device.

FIG. 18-1 is a block diagram illustratively depicting an example of a wafer-to-wafer bonding operation.

FIG. 18-2 is a block diagram illustratively depicting an example of a die-to-wafer bonding operation.

FIG. 18-3 is a block diagram illustratively depicting an example of another die-to-wafer bonding operation.

FIG. 18-4 is a block diagram illustratively depicting an example of a die-to-die bonding operation.

FIG. 18-5 is a block diagram illustratively depicting an example of a die-to-die bonding operation.

FIGS. 19-1 through 19-3 are respective flow diagrams depicting respective examples of assembly flows.

DETAILED DESCRIPTION

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Figure 3:
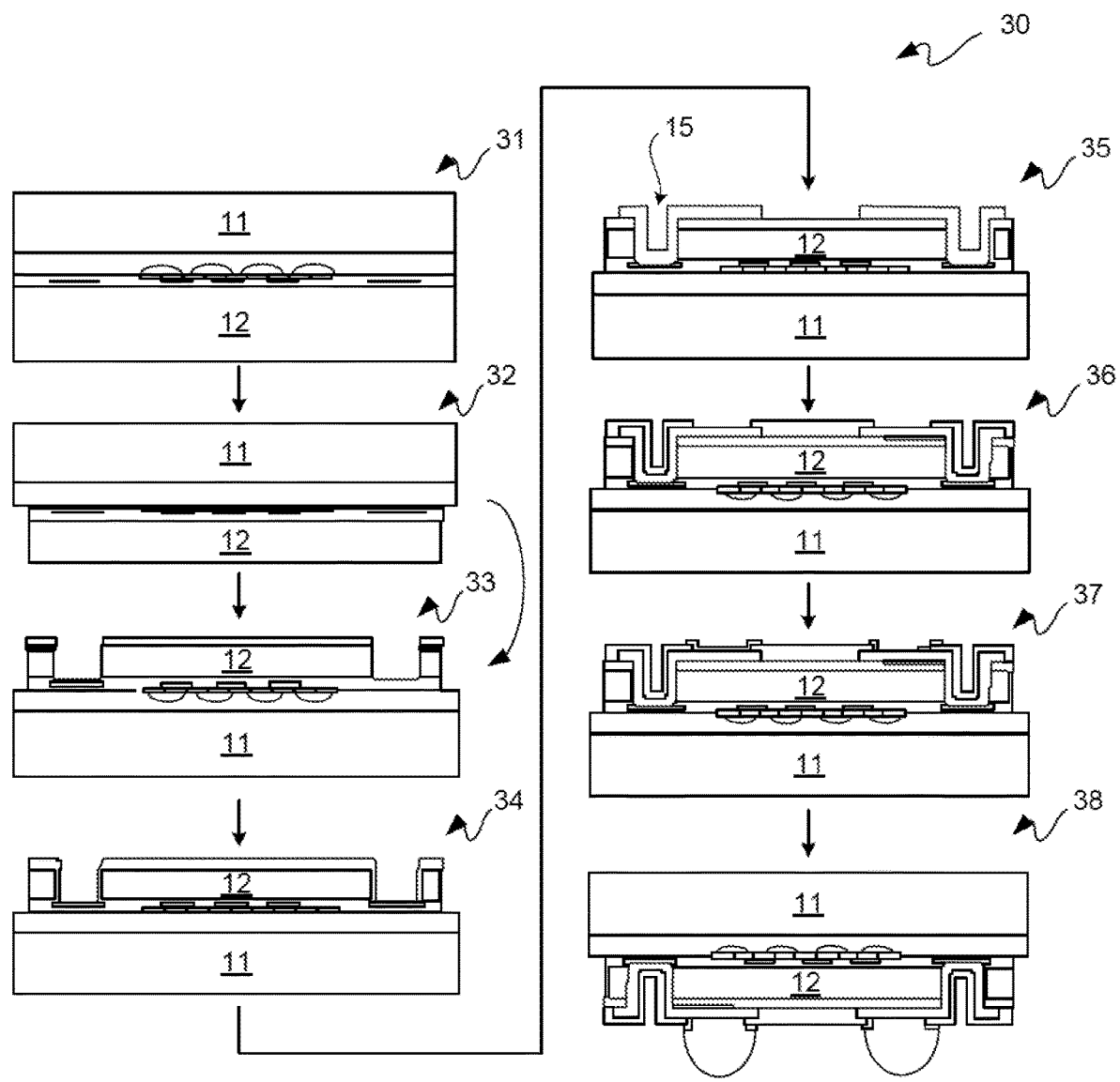
FIG. 3 is a progression of cross-sectional side views illustratively depicting an exemplary conventional process flow, which may be used to form the conventional image sensor device of FIGS. 1 and 2 for a bulk substrate device.
Figures 1, 17:
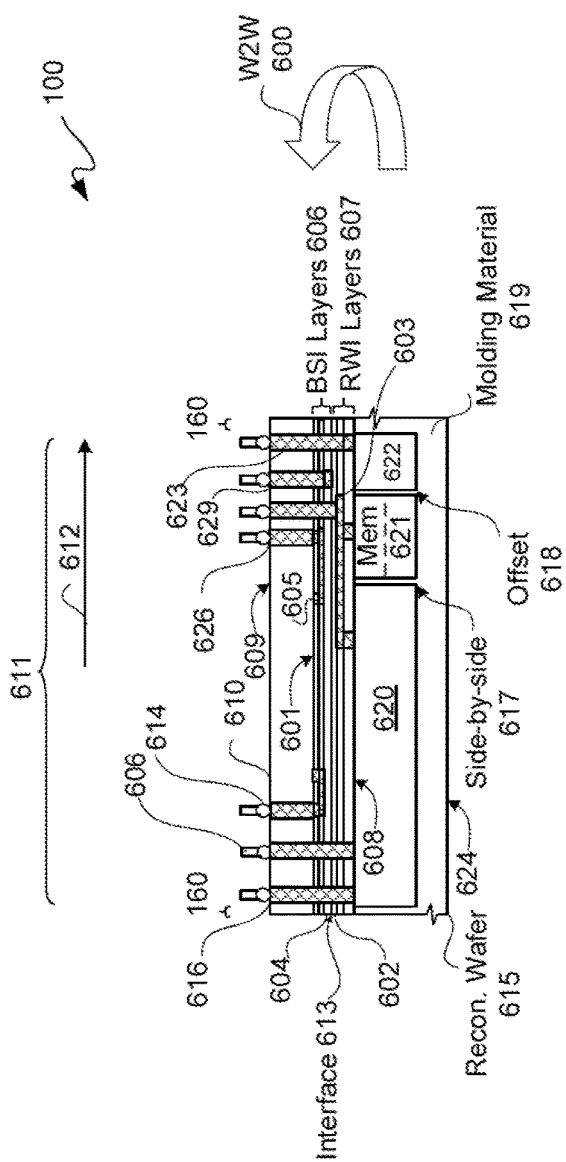
Figures 2, 17:
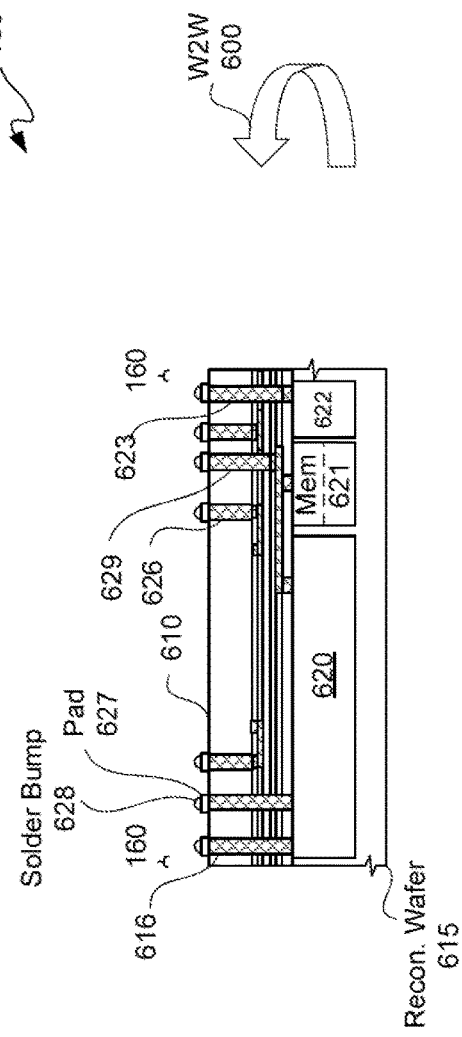
Figures 5, 17:
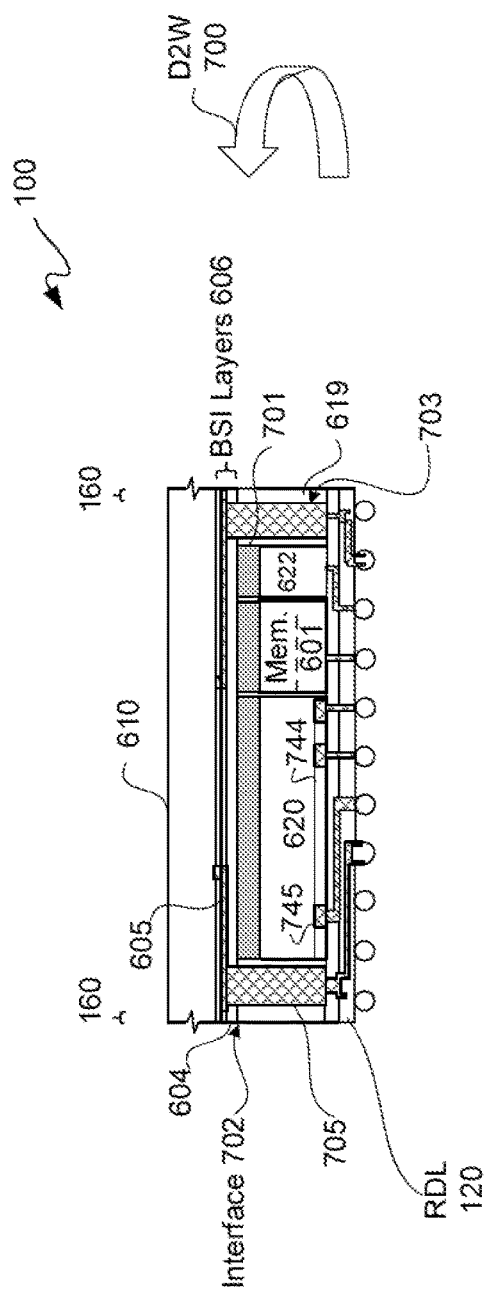
Figures 6, 17:
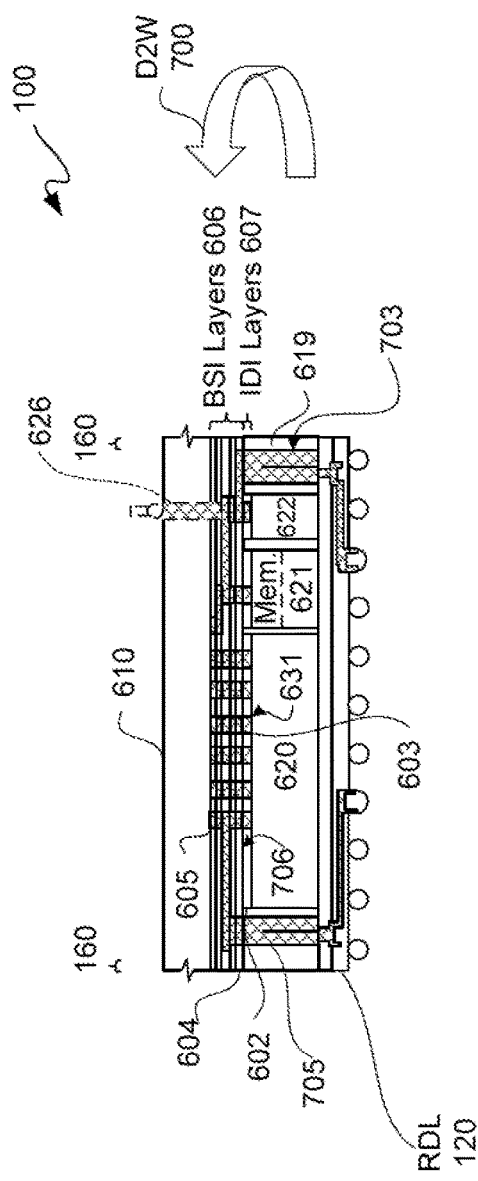

Before a detailed description is provided, a more detailed description of the context of the prior art may be useful. Along those lines, FIG. 1 is a top-down perspective and cut-away view illustratively depicting an exemplary conventional image sensor device 10. FIG. 2 is a cross-sectional side view illustratively depicting the conventional image sensor device 10 of FIG. 1. FIG. 3 is a progression of cross-sectional side views illustratively depicting an exemplary conventional process flow 30, which may be used to form the conventional image sensor device 10 of FIGS. 1 and 2. As image sensor device 10 and process flow 30 are known, unnecessary detail in the description thereof is not provided for purposes of clarity and not limitation.

Generally, with reference to FIGS. 1-3, a transparent cover sheet, such as a sheet of glass ("cover glass") 11 for example, and a large-scale integration ("LSI") image sensor chip or die ("substrate" or "sensor chip") 12 having a pixel array 18 are attached to one another with an adhesive 13 defining a cavity 14 between them. In the cavity 14, there is/are one or more micro lenses ("micro lens") 22 on one or more color filters ("color filter") 21. The color filter 21 may be on a front side surface of an LSI image sensor chip or die 12 ("substrate" or "silicon"). There may be a slight gap between a lower surface of the cover sheet ("cover glass" or "glass") 11 and an upper surface of the micro lens 22.

In process 30, after attaching or bonding at 31, there may be a back-grinding and stress relieving of the substrate 12 at 32, where the glass 11 may be used as a carrier. The substrate 12 may be flipped over and via etched at 33, followed by formation of via insulation at 34 and via metalization at 35 to form through substrate vias, such as through silicon vias ("TSVs") 15 for example. On a back side surface of the substrate 12, via metalization of such TSVs 15 may be passivated at 36 followed by under-bump metalization at 37 to form bond pads 16 including any redistribution layers and then forming of external interconnects ("bumping") at 38, such as to form back side bumps 17. Because bumps 17 of bumping are interconnected to TSVs 15 of the substrate 12, a separate controller die or chip (not shown in FIGS. 1 and 2) is conventionally coupled alongside of or otherwise spatially removed from a package of image sensor device 10.

Figure 4:
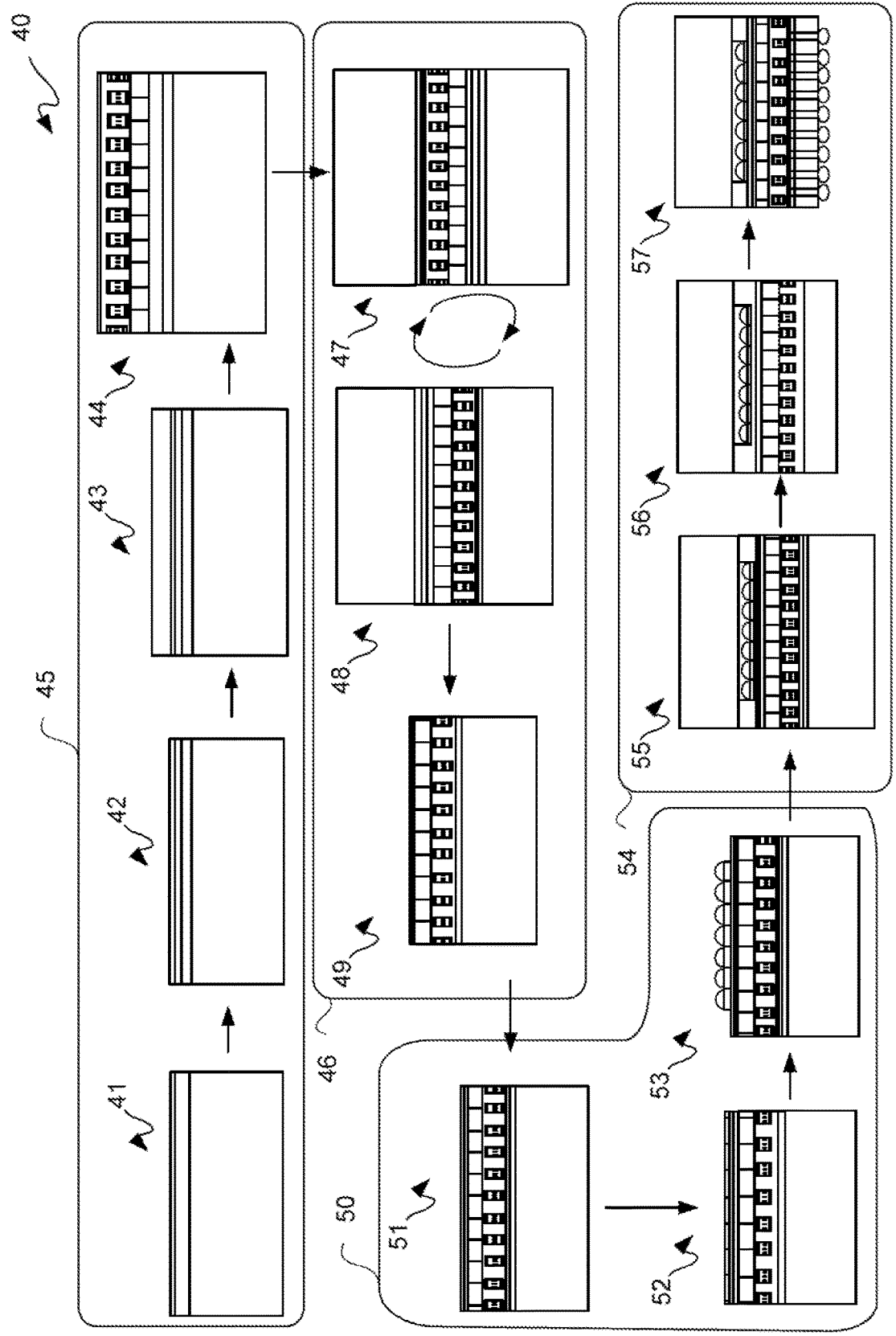
FIG. 4 is a progression of cross-sectional side views illustratively depicting an exemplary conventional process flow, which may be used to form the conventional image sensor device of FIGS. 1 and 2 though for a substrate-on-insulator substrate device.

While process flow 30 is for a bulk silicon substrate 12, one or more other semiconductive material(s) may be used for such substrate 12. Furthermore, rather than a bulk substrate 12, a substrate on insulator wafer may be used, such as for example a silicon on insulator ("SOI") wafer. Along those lines, FIG. 4 is a progression of cross-sectional side views illustratively depicting an exemplary conventional process flow 40, which may be used to form back side illuminated (BSI) image sensor device 10 of FIGS. 1 and 2, though for an SOI device. This formation may be done with wafer-level packaging ("WLP"). As process flow 40 is known, unnecessary detail in the description thereof is not provided for purposes of clarity and not limitation.

Operations 45 are for Front-End Of Line ("FEOL") processing. At 41, an SOI wafer is obtained. At 42, gradient implants are implanted into the wafer. At 43, epitaxial growth and annealing is performed. At 44, pixel and photo diode processing is performed.

Operations 46 are for Back-End Of Line ("BEOL") processing. At 47, bonding to a final carrier is performed. At 48, the wafer and carrier is flipped over. At 49, back side grinding or other thinning of the SOI wafer is performed down to the buried oxide layer ("BOX") to expose a back or underside of the SOI wafer. This operation at 49 may include laser annealing.

Operations 50 are for forming optical components. At 51, one or more anti-reflective ("AR") coatings are deposited. At 52, color filters are formed. At 53, microlenses are formed.

Operations 54 are "packaging" operations. At 55, glass is bonded to the wafer. At 56, front side grinding or other thinning of the carrier is performed. At 57, TSVs for a three dimensional package or a WLP are formed followed by formation of bumps.

Figure 6:
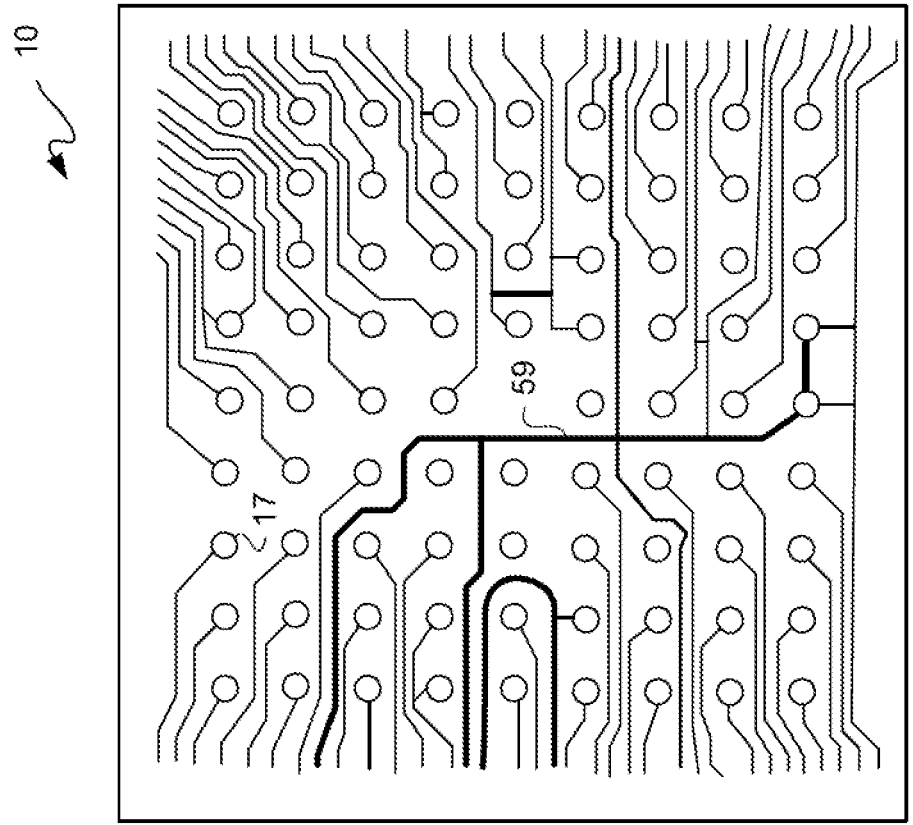
FIG. 6 is a bottom plan view depicting an exemplary conventional image sensor device.
Figure 5:
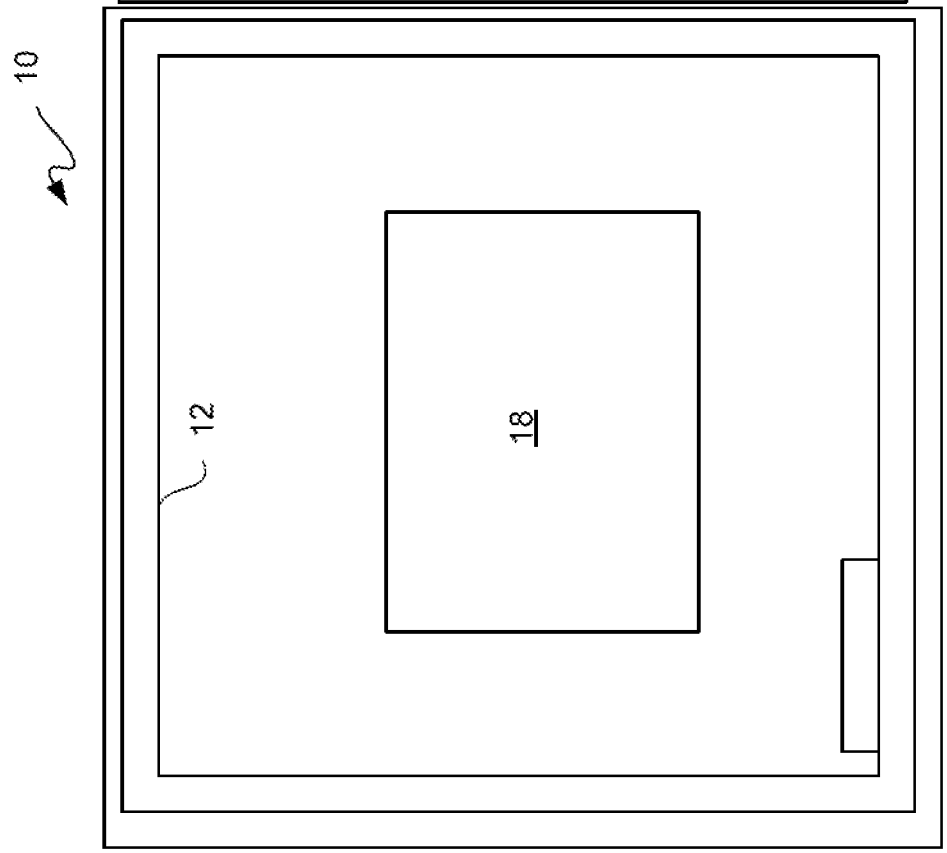
FIG. 5 is a top plan view depicting an exemplary conventional image sensor device.

FIG. 5 is a top plan view depicting an exemplary conventional image sensor device 10, and FIG. 6 is a bottom plan view depicting an exemplary image sensor device 10. In FIG. 5, an image sensing portion, such as a pixel array 18 (center box) of an image sensor device 10 is conventionally located in a middle portion of a substrate 12, and so TSVs 15 conventionally are around a perimeter of image sensor device 10 with bond pads coupled to such TSVs. In other words, because an image sensor device 10 is a sensitive active device during operation, conventionally other circuitry is disposed away from such image sensing portion, such as pixel array 18. However, bumps 17 for coupling to such perimeter of bond pads 16 may be coupled through traces 59 on a back side of such substrate 12 as depicted in FIG. 6.

Bumps 17 and the ball grid array (BGA) at the bottom of the image sensor device shown in FIG. 6 is just one example of how the image sensor device is electrically connected to the motherboard. In another example, the bottom side of the image sensor device is attached to an organic substrate using an adhesive and electrically connected to this organic substrate via wire bonds directly connecting the top of the image sensor to the organic substrate.

Conventionally, a controller and image processor (not shown) is a separate chip externally coupled to a plurality of bumps 17 of such back side of such substrate 12 as depicted in FIG. 6. Because an image sensor device 10 is conventionally a low-profile device, in the past this has meant having TSVs 15 directly connected to bond pads 16 for direct connection with traces 59 and bumps 17, such as previously described.

To reduce propagation delay between an image sensor device and a controller therefor and provide a low profile device, described below is an image sensor device package having another die embedded with an image sensor device in a common package. In the example below, a controller die ("controller") is embedded with an image sensor device in a common package; however, in another implementation, another type of die, e.g. an image processor die generally used in a camera or other imaging device, may be embedded with an image sensor device in a common package.

Figures 7, 17:
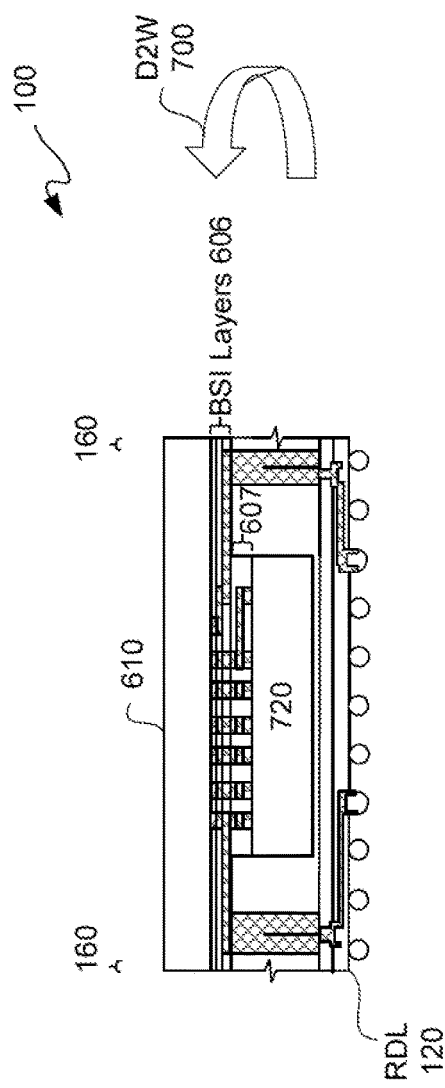
Figures 8, 17:
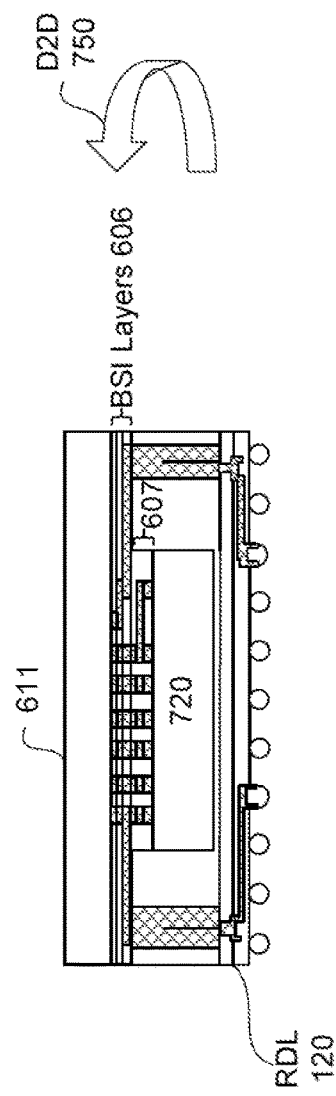

FIG. 7 is a cross-sectional side view illustratively depicting an exemplary image sensor device 100 with dicing lanes 160 for sensor dies 170 in substrate 110, and FIG. 8 is a cross-sectional side view illustratively depicting an exemplary image sensor device 100 with dicing lanes in mold cavities, such as channels, 140. Image sensor devices 100 of FIGS. 7 and 8 are similar. However, in image sensor device 100 of FIG. 8, rather than dicing in lanes of a wafer of substrate 110 having sensor dies 170, dicing through mold cavities 140, namely spaced apart sensor dies 170 defining mold cavities or channels therebetween, may be used. Even though an image sensor die 170 is described, other types of integrated circuit dies having input and/or output signal lines proximally disposed to an outer perimeter thereof may be used.

The implementation of FIG. 8 may be for a reconstituted wafer for substrate 110, whereas the implementation of FIG. 7 may be for a wafer-level process or WLP. Even though either implementation illustratively depicted may be used, for purposes of clarity by way of example and not limitation, the implementation associated with FIG. 7 is generally further described though the implementation associated with FIG. 8 may be understood from the following description.

Figures 9, 17:
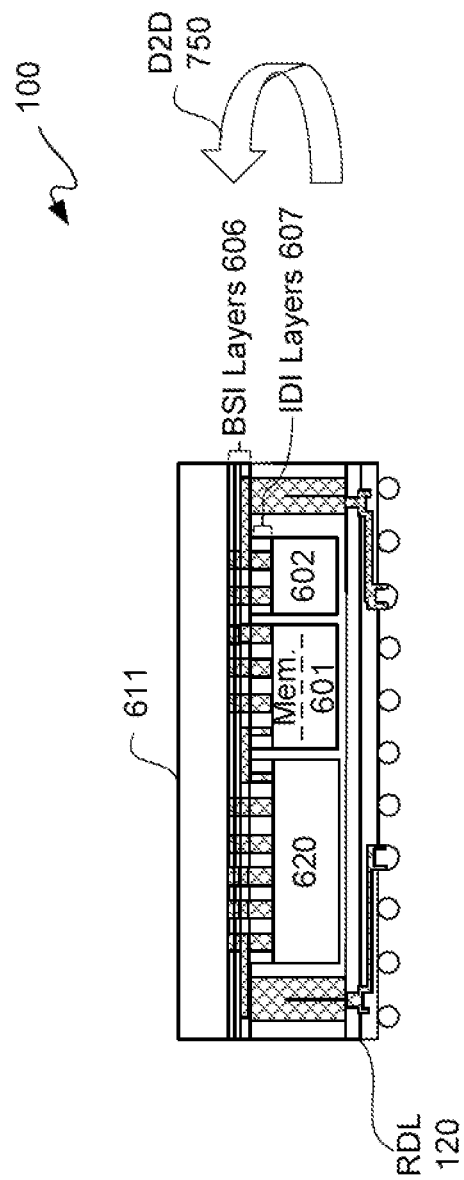

Along those lines, FIG. 9 is a progression of cross-sectional side views illustratively depicting an exemplary process flow 200, which may be used to form image sensor device 100 of FIG. 7. The description herein is for a wafer-level process ("WLP") flow, in contrast to a substrate/chip in a mold or a reconstituted wafer process flow. However, the following description likewise applies to a reconstituted wafer process as shall be apparent to one of skill in the art.

An image sensor wafer or substrate 110 may have multiple image sensor devices to be diced from one another, though only a single image sensor die 170 is illustratively depicted for purposes of clarity and not limitation. As described hereinbelow, slots, channels and/or vias may be formed in such a wafer from and in a back side thereof. In an implementation, a molding material may be deposited, including without limitation injected, along a back side surface of such wafer including into dicing lanes thereof. In another implementation, channels and/or vias are formed in a wafer from a back side thereof; however, these channels and/or vias are not metalized as in a conventional TSV flow. With simultaneous reference to FIGS. 7 through 9, image sensor devices 100 are further described.

At 201, a substrate 110 may be obtained having image sensor dies 170 and a conductive layer, such as a metal layer, 111 may be deposited or otherwise plated onto an upper surface 115 of substrate 110. Substrate 110 may be an optically sensitive/activatable semiconductor wafer having a plurality of sensor dies 170 formed therein. This wafer may be a silicon wafer or other semiconductor wafer. This example implementation is for a "front side" image sensor device 100. Such substrate 110 may have an anti-reflective coating ("ARC"; not shown in this figure for purposes of clarity and not limitation) deposited on upper surface 115, as is known. A metal interconnect layer, namely metal layer 111, on an upper surface 115 of substrate 110 may be used as an etch stop layer for a "via" etch, or more appropriately a channel etch, as described below in additional detail. In this example, only one metal layer 111 is depicted for simplicity; however, this or another implementation may have one or more metal layers to effectively connect diodes under pixels to bond pads 131 at the periphery.

Metal layer 111 may be plated on an active upper surface 115 outside of an optically activatable portion or surface of die 170 for physically coupling to bond pads 131 for electrical conductivity, where bond pads 131 are formed in sensor dies 170 at or proximal to an upper surface or front side surface of substrate 110 as part of an image sensor die fabrication process. For purposes of clarity by way of example and not limitation, a micro lens 22 and a color filter 21 are illustratively depicted in FIGS. 7 through 9 but not described in unnecessary detail for purposes of clarity and not limitation. Generally, electrical connections to diodes under pixels may be established though these metal layers interconnecting such pixels to pads 131. Hence, traces or lines of such metal layers may travel to active areas and pixels. In a front side image sensor die, metal layers are above or on top of diodes, which may obstruct a light path. However, in a back side image sensor die ("BSI sensor"), diodes may be above or on top of such metal layers, namely metal lines are below such diodes. Optionally, stud bumps 130 may formed at 201 to be positioned on metal layer 111 portions corresponding to upper bond pads 131 on a surface thereof opposite wire bond wires 150 to provide additional rigidity to upper bond pads 131.

A glass or cover glass or other optically suited material ("cover glass") 11 may be coupled to a substrate 110 with an adhesive 13 at 202, such as to provide an offset for a cavity 14 for a micro lens 22 and a color filter 21. Adhesive 13 may be used to adhere glass cover 11 to at least one of a conductive layer, such as metal layer 111, or a front side surface 115 of substrate 110, where glass cover 11 is offset from and over an optically-activatable portion of a front side surface 115 for defining a gap, such as air cavity 14, between an underneath side of glass cover 11 and such portion of a front side surface 115. Cover glass 11 may be a glass wafer coupled to an image sensor wafer or substrate 110 using adhesive 13. In an implementation, air cavity 14 may be approximately 50 to 100 microns thick or tall. In another example, no separate cover glass may be coupled to or be a part of an image sensor device.

Adhesive 13 may likewise be around a pixel array area, namely generally proximal to a perimeter of die 170 without being located in a pixel array area. Thus, adhesive 13 may be deposited or otherwise applied to or put in contact with an upper surface of metal layer 111. Adhesive 13 may provide an offset between an upper surface of metal layer 111 and a lower surface of cover glass 11 to define a cavity 14 therebetween, such as previously described.

At 203, a substrate 110, such as a wafer, may optionally be ground, polished, or otherwise thinned to reduce overall thickness prior to drilling or etching channels or slots therein. Further at 203, substrate 110 may be drilled or etched or otherwise formed to provide vias and/or channels or slots ("channels") or mold cavities 140 therein. This channel etching or drilling may be from a back side surface 212 of a wafer or substrate 110 used to form dies 170 down toward a front side surface of such a wafer or substrate 110. In another implementation, etching may form a chamfered edge along one or more sides of dies 170 of substrate 110. Although, side walls of vias or channels are depicted to be vertical side walls, in another implementation such sidewalls may slanted at an angle with respect to the vertical direction.

For etching, a masking layer may be patterned prior to etching using a mask, and this may add additional costs. To avoid this additional cost, direct laser drilling may be used to form channels 140 across a back side surface 212 of a wafer or substrate 110 for multiple image sensor dies 170 thereof. Such channels may be located at or proximal to the peripheries of active areas of image sensor dies 170. Thus, each image sensor die 170 may effectively have a continuous or discontinuous channel 140 around an active area thereof. Channels 140 may extend from a lower surface of substrate 110 completely through to an upper surface of substrate 110, and thus may be thought of as through-substrate channels 140.

Etching or drilling may be used to temporarily expose or reveal surfaces of bond pads 131 generally at the bottom of a channel 140. Whether etching or drilling, metal layer 111, as well as bond pads 131, may be used as a stop layer at 203 for such etching or drilling. Moreover, such etching or drilling may be selective to material of wire bond wires 150, as well as bond pads 131 and metal layer 111.

In this example, bond pads 131 are at least partially disposed within a channel 140. However, for bond pads formed of metal layer 111 for example, a channel 140 may be aligned to bond pads, or vice versa, though at least partially disposed outside a channel 140. Accordingly, generally channels and bond pads are aligned with one another, with such bond pads at or proximal to an upper surface of substrate 110 for access from a lower surface of substrate 110 via a channel 140.

At 204, bond pads 131, which may be formed with a bondable metalization, may optionally be oxide and/or metal etched at a bottom of such channels 140. Along those lines, this etching may be to remove oxidation prior to wire bonding. Optionally, at 204 a metal etch may be used to electrically disconnect two or more bond pads 131 from one another interconnected to one another by metal layer 111. However, generally it may be easier to pattern metal layer 111 and form separate bond pads during a plating/BEOL process. Thus, wire bond wires 150, bond pads 131, and metal layer 111 may be formed of different materials for selectivity to partially etch metal layer 111, which may partially etch bond pads 131 too, while not significantly removing material of wire bond wires 150. In an example, the top metal layer of metal layers 111 may be formed of aluminum and multiple bottom layers may be formed of copper, as wire bonding on aluminum pads is a conventional process.

Bond pads 131 may be disposed around a pixel array. A subsequent optional oxide and/or metal etch at a bottom of such channels 140 may be used to enhance subsequent bonding thereto and/or to physically disconnect bond pads 131 from one another due to metal layer 111, as illustratively depicted at operation 204. However, for purposes of clarity by way of example and not limitation, it shall be assumed that such optional etching is not used in this implementation.

Further at 204, wire bond wires 150 may be bonded to upper surfaces of conductive bond pads 131 along bottoms of channels 140 of a wafer or substrate 110. For a WLP, wire bond wires 150 may be bonded to bond pads 131 located along the base or bases of such one or more trenches or channels 140. Wire bond wires 150 may be ball bonded or use another type of bonding at 204 to bond pads 131.

Wire bond wires 150 may extend vertically away from bond pads 131. After bonding, severing of feed wire of wire bond wires 150 may be performed above channels 140 for having wire bond wires 150 exit channels 140 at the top. Along those lines, tips 151 of wire bond wires may extend above an upper surface 212 of dies 170 of a wafer or substrate 110, namely, extend above an upper opening 153 of channels 140 to be located outside of channels 140, after severing from a feed wire. Such a feed wire may be a copper feed wire for copper bond pads 131. Aluminum or gold wires can additionally or alternatively be used. Optionally, a coated copper wire, e.g. palladium coated copper wire, or other wire bond wire may be used. In another example, tips 151 of wire bond wires 150 may be flush with or even below an upper surface 212 of dies 170.

Rather than using TSVs plated or filled with a conductive material, such as a metal for example, such vias and/or channels 140 may have wire bond wires 150 extending from a bottom or bottoms thereof. Wire bond wires 150 may be of an array, and may be known as BVA™ wires, referring to a "free standing" array of wire bonds. Thus, BVA wire bonds may be disposed in channels 140 with tips 151 extending out of and above such channel openings 153 in a free standing configuration prior to molding. In another implementation, tips 151 may be even with or below channel openings 153.

Another set of bond pads 102, which may be part of or interconnects for a redistribution layer ("RDL") 120, may be formed over filled channels 140, generally on a same plane as a back side surface of die 170. Moreover, bond pads 102 may be formed in or partially in channels 140 to further reduce overall thickness of image sensor devices 100. However, for purposes of clarity by way of example and not limitation, it shall be assumed that bond pads 102 are formed as part of an RDL 120, where such RDL 120 is formed on a molding layer 141, including without limitation an epoxy molding compound, as described below in additional detail. Bond pads 102 may be formed such that they interconnect to tips 151 located above, flushed or below upper surface 212 of a die 170.

Along those lines, each die 170 is in a face-up orientation in FIGS. 7 and 8. By having upper ends (lower ends at operation 204) of wire bond wires 150 and associated upper bond pads 131 disposed generally in a same or common horizontal plane as a face-up front face/front side or active surface 115 of substrate 110, connections from substrate 110, or more particularly dies 170 thereof, to upper bond pads 131 may be formed without having to wire bond down to a lower surface. This common orientation of position may shorten overall wire length for some applications and/or may avoid plating or filling TSVs in substrate 110. Having to wire bond down to a lower surface may be in some package-in-package configurations, such as in U.S. Pat. No. 8,618,659, which is incorporated by reference herein in its entirety for all purposes.

At least a portion of wire bond wires 150 may extend in channels 140, which is referred to as mold cavity 140, as a molding material 215 is deposited, injected, or otherwise loaded into such channels 140 at 205. This mold cavity 140 may be in a mold (not shown) in which one or more singulated in-process image sensor devices 100 are loaded, such as for a reconstituted wafer; or for WLP, channels 140 may be formed along perimeters of dies 170 of substrate 110, such as into image sensor dies 170 proximal to one or more sides thereof. For purposes of clarity by way of example, it shall be assumed that molding for WLP is used for the following description, though the following description generally applies to both implementations.

Deposition of molding material 215 may cover a back side surface or lower surface 212 (an upper surface at operation 205) of die 170 or generally substrate 110, which may include another molding material or coating, to provide molding material ("molding") layer 141. In an implementation, at 205 a wafer or substrate 110 may be transfer molded with molding material 215 with a mold assist film (not shown) to allow tips 151 to extend above an upper surface of molding layer 141. Molding material 215 and molding layer 141 may be formed of the identical material. Film assist molding may be used to keep upper ends 151 of wires 150 from being covered with molding material 215 for subsequent interconnection with lower bond pads 102. With upper ends 151 of wires 150 extending above an upper front face surface of substrate 110, in this example implementation molding material 215 may be deposited and then ground back to provide a planarized surface of molding layer 141 and upper ends 151 of wires 150 for formation of lower bond pads 102.

In another implementation, tips 151 may be completely covered after molding at 205, and back grinding or polishing of an upper surface of molding layer 141 may temporarily expose upper ends 151 of wire bond wires 150 for physical connection with bond pads 102 to be formed.

To recapitulate, wire bond wires 150 may be bonded to upper bond pads 131 at 204 followed by deposition of molding material 215 at 205, and then such upper ends (lower ends with respect to FIGS. 7 and 8) 151 of wire bond wires 150 may subsequently be interconnected to lower bond pads 102, as described below in additional detail.

At 206, bond pads 102 may be formed over upper ends 151 of wire bond wires 150. An RDL 120 may be formed after formation of bond pads 102. RDL 120 may include one or more conductive layers and one or more dielectric layers. Optionally, bond pads 102 may be formed as part of RDL 120. This inverse orientation effectively converts lower bond pads 102 to base bond pads. Thus, base bond pads 102 may be generally in a same or common horizontal plane as a back side lower surface of substrate 110, or more particularly image sensor dies 170 thereof for a WLP. This allows for a face-up configuration of an image sensor die 170 or a substrate 110 with base or lower bond pads 102 being associated with a back side surface of such face-up oriented substrate 110, which is an opposite orientation with respect to that in U.S. Pat. Pub. No. 20140175671 A1, which is incorporated by reference herein in its entirety for all purposes.

As lower bond pads 102 may be formed on molding layer 141, and as RDL 120 may be formed on lower bond pads 102, lower bond pads 102 as well as RDL 120 may not come into direct contact with substrate 110, or more particularly an associated image sensor die 170. In an implementation at 206, traces 103 of RDL 120 may be used to couple a perimeter of lower bond pads 102 to bump pads or receptors 104 for interconnection with associated bumps 101. Accordingly, substrate 110, or more particularly an image sensor die 100, may have a front face up orientation with a shorter wiring path to reduce signal propagation delay for operation of such an image sensor device 100.

Optionally, one or more chips or dies may be coupled to RDL 120, generally at a back side of image sensor device 100 to provide a multi-die or multi-chip image sensor module. Such other chip or die may include an image processor or a controller chip.

One or more operations associated with forming a TSV including forming a dielectric boundary, a barrier layer, a seed layer, and an associated TSV metal plating may be avoided. Having an RDL 120 on one common surface, namely on only mold material of molding layer 141 in this example implementation and on no other material surface, may provide better reliability in comparison to conventional Fan-Out Wafer Level Packaging ("FOWLP"), as for example RDL 120 metal is not transitioned between an Si substrate surface, such as of a wafer or substrate 110, and a molding material surface of molding material 215. Furthermore, a coefficient of thermal expansion ("CTE") of molding material 215, or a combination of molding and/or coating layers, of molding layer 141 may more closely correspond to a PCB material.

Moreover, molding layer 141 may have a larger surface area than substrate 110 for purposes of bump pads 104, namely for purposes of "bumping out" for providing a FO capability. A conventional CMOS image sensor device with TSVs has dimensional restrictions due to locations of such TSVs; however, by avoiding TSVs, these dimensional restrictions may be avoided. Along those lines, more of an edge area around a perimeter of substrate 110 may be etched to make such additional space available for wire bond wires 150 in comparison to TSVs. Along those lines, in another implementation, RDL 120 may extend up (down at operation 206) along sidewalls 220 of substrate 110. In an implementation, RDL 120 may be formed partly on molding layer 141 and partly on substrate 110, like in a FOWLP.

FIG. 10 is a cross-sectional side view illustratively depicting an exemplary image sensor device 100 with dicing lanes 160 for image sensor dies 170 formed in a substrate 110, where image sensor dies respectively have an optional embedded die 300 coupled to thereto. An embedded die 300 may be a controller die, an image processor die or another chip performing any other functionality that is located in die cavities 301 of corresponding image sensor dies 170. Although only one die 300 and only one cavity 301 is illustratively depicted in FIG. 10, there may be more than one die 300 or more than one cavity 301 at the back side of an image sensor device 100. In another implementation, there may be more than one die in one cavity.

Even though singulation of an image sensor device 100 from a substrate 110 is described herein, in another implementation more than one image sensor die 170 may be used in an image sensor device 100, where such image sensor dies 170 may be coupled to one another after dicing from a substrate 110. Accordingly, such image sensor dies 170 may have a substrate 110 and a glass cover 11 respectively in common with one another after dicing.

FIG. 11 is a cross-sectional side view illustratively depicting an exemplary image sensor device 100 with dicing lanes 160 for an image sensor die 170 formed in "thinned" substrate 110 with an optional embedded die 300 coupled to image sensor die 170. Even though a single embedded die 300 is illustratively depicted in FIG. 11, in other implementations more than one embedded die may be used. Furthermore, even though embedded die 300 is described below as a "controller" 300 as associated with a controller for controlling an image sensing device, as described herein, in another implementation embedded die 300 may be a driver or an image processor die. However, for purposes of clarity by way of example and not limitation, it shall be assumed that embedded die 300 is a controller 300. Although only one embedded die 300 is illustratively depicted in FIG. 11, there may be more than one embedded die 300 at the back side of an image sensor device 100.

Figure 12:
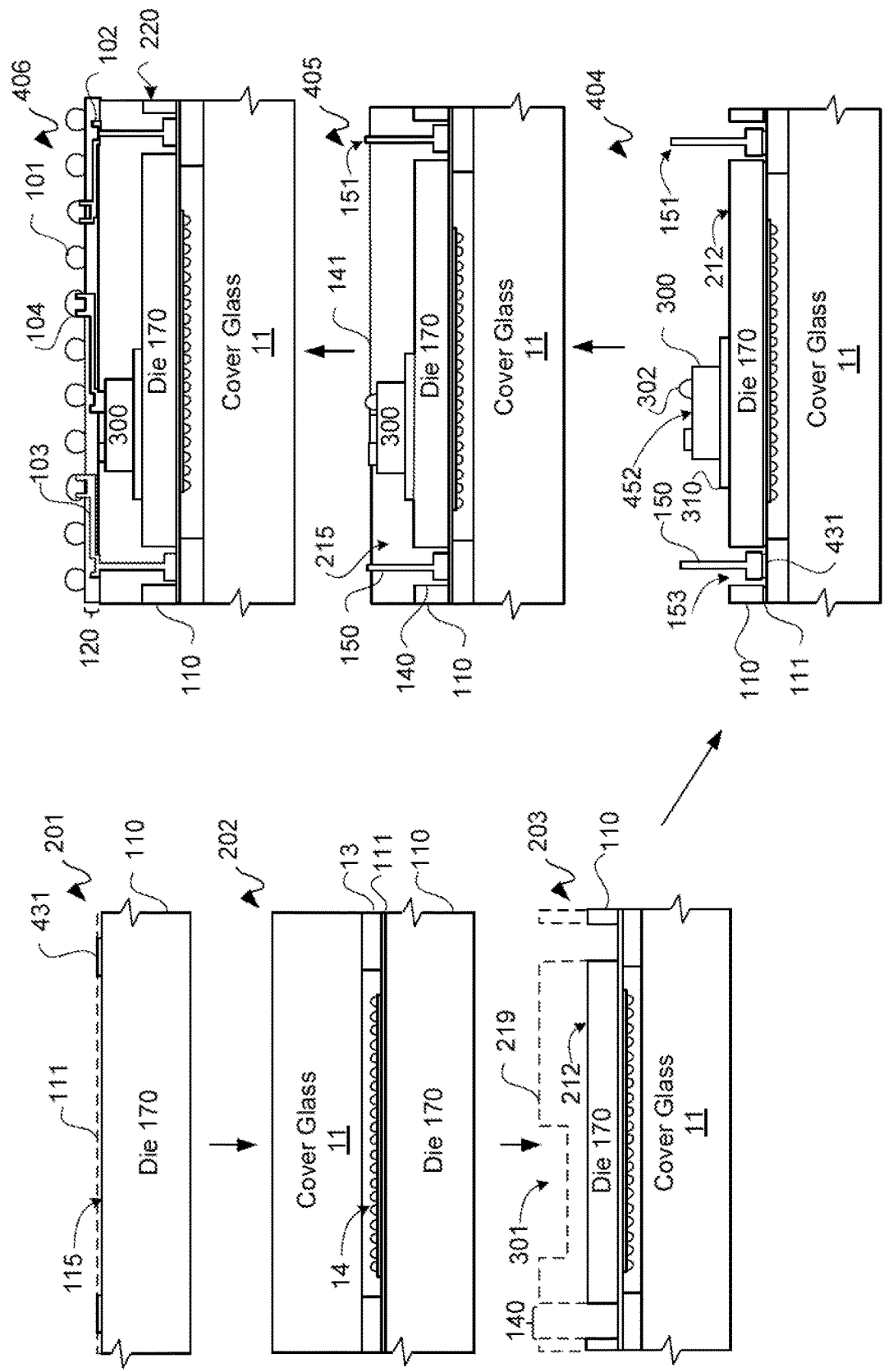
FIG. 12 is a progression of cross-sectional side views illustratively depicting an exemplary process flow, which may be used to form the image sensor device of FIG. 11.

An image sensor device 100 may be provided in a single package with a controller 300 optionally embedded in a packaged image sensor device 100. FIG. 12 is a progression of cross-sectional side views illustratively depicting an exemplary process flow 400, which may be used to form image sensor device 100 of FIG. 11. Even though the following description is for a WLP process 400, the following description may be used in a reconstituted wafer process as shall be apparent to one of skill in the art from the following description.

With simultaneous reference to FIGS. 7 through 12, image sensor devices 100 are further described. Along those lines, as details with respect to image sensor devices 100 of FIGS. 10 through 12 are the same or similar to image sensor devices 100 of FIGS. 7 through 9, some of those same or similar details are not repeated for purposes of clarity and not limitation.

At 201, a metal layer 111 may be deposited or otherwise plated onto an upper surface 115 of substrate 110, such as a wafer having a plurality of sensor dies 170 formed therein, as previously described. Optionally, metal layer 111 may be patterned to provide bond pads 431 for interconnecting to image sensor die 170. However, for purposes of clarity by way of example and not limitation, a continuous metal layer 111 in cross-section is illustratively depicted. Again, optionally, stud bumps 130 may formed at 201 to be positioned on metal layer 111 portions corresponding to upper bond pads 431 on a surface thereof opposite wire bond wires 150 to provide additional rigidity to upper bond pads 431.

Such substrate 110 may have an anti-reflective coating ("ARC"; not shown in this figure for purposes of clarity and not limitation) deposited on upper surface 115, as is known. Again, for purposes of clarity by way of example and not limitation, a micro lens 22 and a color filter 11 are illustratively depicted in FIGS. 10 through 12 but not described in detail for purpose of clarity and not limitation.

At 202, a glass cover glass 11 may be coupled to a substrate 110 with an adhesive 13, as previously described.

At 203, a substrate 110, such as a wafer, may be ground, polished, or otherwise thinned to reduce overall thickness prior to drilling or etching channels or slots therein, as similarly previously described. In this implementation, substrate 110 may be thinned for coupling a controller 300 to a sensor die 170 thereof for a low-profile image sensor 100.

Further at 203, substrate 110 may be laser drilled or wet or dry etched or otherwise formed to provide through channels 140 therein, as previously described. For image sensor device 100 of FIG. 10, a controller die cavity 301 may be formed when forming mold cavities 140 at 203, as generally indicated by dashed line 219. Generally, substrate 110 is much thicker than needed for formation of image sensors for image sensor device 100. Most of this thickness is to provide separation of image sensors of image sensor device 100 from heat and/or interfering signals at an interconnect side of image sensor device 100. However, generally there may be about 10 or fewer wires that interconnect to controller 300, and controller 300 may have a limited amount of circuitry generating heat. Additionally, controller 300 may have a much smaller surface area than an image sensor die 170 of substrate 110. In short, controller 300 may have a small thermal impact. However, in another implementation, an image processor die 300 may be used. Furthermore, controller die cavity 301 may be formed off to one side of substrate 110 to reduce possibility for thermal interference with sensors of a pixel array of image sensor die 170. A controller die 300 may be coupled to a back side surface of substrate 110 to be at least partially in controller die cavity 301.

However, for purposes of clarity by way of example and not limitation, it shall be assumed that image sensor device 100 is formed as described with reference to FIG. 12, as previously stated. Again, channels 140 may be located at or proximal to the peripheries of active areas of image sensor dies 170. Thus, each image sensor die 170 may effectively have a continuous or discontinuous channel 140 around an active area thereof. Again, whether etching or drilling, metal layer 111 may be used as a stop layer at 203.

However, in this example, metal layer 111 is used for providing bond pads, such as bond pads 431. Bond pads 431 may be disposed around a pixel array of sensor die 170. Along those lines, bond pads 431 of metal layer 111 may be formed with a bondable metalization, and a subsequent oxide and/or metal etch at a bottom of such channels 140 may optionally be used to enhance subsequent bonding thereto and/or to optionally physically disconnect bond pads 431 from one another, as illustratively depicted at operation 404. With respect to the former, this etching may be to remove oxidation prior to wire bonding. However, for purposes of clarity by way of example and not limitation, it shall be assumed that such optional etching is not used in this implementation.

At 404, a back side of controller or image processor die 300 may be coupled to a back side of sensor die 170, namely along upper surface 212, with an adhesive 310. Along a front side surface of controller 300, namely upper surface 452, there may be die pads and/or interconnects, generally contacts 302.

Additionally, at 404, wire bond wires 150 may be bonded to upper surfaces of bond pads 431 along bottoms of channels 140 of a wafer or substrate 110. For a WLP, wire bond wires 150 may be bonded to bond pads 431 located along the base or bases of such one or more trenches or channels 140. Wire bond wires 150 may be ball bonded or use another type of bonding at 404 to bond pads 431.

Wire bond wires 150 may extend vertically away from bond pads 431. After bonding, severing of feed wire used to form wire bond wires 150 may be performed above channels 140. Along those lines, tips 151 of wire bond wires may extend above or to an upper surface 452 of controllers 300 adhered to corresponding sensor dies 170 of a wafer or substrate 110, namely, extend above an upper opening 153 of channels 140, after severing from a feed wire.

Again, rather than using TSVs plated or filled with a conductive material, such as a metal for example, such vias and/or channels 140 may have wire bond wires 150 extending from a bottom or bottoms thereof. Wire bond wires 150 may be of an array, and may be known as BVA™ wires. Thus, BVA wire bonds may be disposed in channels 140 with tips 151 extending out of and above such channel openings 153 in a free standing configuration prior to molding. In this implementation, tips 151 may be even with or above upper surface 452 of controller 300, and bond pads 102 for an RDL 120 may be formed on a molding layer 141, as described below in additional detail.

Along those lines, image sensor dies 170 are in a face-up orientation in FIGS. 10 and 11, and controllers 300 are in a face-down orientation in those respective figures. Again, by having upper ends (lower ends at operation 404) of wire bond wires 150 and associated upper bond pads 431 disposed generally in a same or common horizontal plane as a face-up front face or active surface 115 of substrate 110, connections from substrate 110, or more particularly dies 170 thereof, to upper bond pads 431 may be formed without having to wire bond down to a lower surface. This common orientation of position may shorten overall wire length for some applications and/or may avoid plating or filling TSVs in substrate 110. Additionally, by having one or more embedded dies in an image sensor device in a face-down orientation, such one or more embedded dies, such as controller 300 in the examples of FIGS. 10 and 11, may be directly interconnected to a circuit board, such as a PCB, to shorten signal path length. Controller or image processor die 300 in FIGS. 10 and 11 may, though need not be, positioned coaxially with respect to a center of a pixel array of image sensor die 170.

A portion of lengths of wire bond wires 150 extends in channels 140, which is also referred to as mold cavities 140, as a molding material 215 is deposited, injected, transferred or otherwise loaded into such channels 140 at 405. This mold cavity 140 may be in a mold in which singulated in-process image sensor devices 100 are loaded for molding, such as for a reconstituted wafer; or for a WLP, channels 140 may be formed along perimeters of dies 170 of substrate 110, such as into dies 170 proximal to one or more sides thereof, and such substrate 110 may be loaded into a mold for injection molding of a molding layer 141. For purposes of clarity by way of example, it shall be assumed that molding for WLP is used for the following description, though the following description generally applies to both implementations.

Deposition, including without limitation by injection, of molding material 215 may coat a lower surface (an upper surface at operation 405) of substrate 110, which may include another molding material or coating, to provide molding layer 141. In an implementation, at 405 a wafer or substrate 110 may be transfer molded with molding material 215 with a mold assist film (not shown) to allow tips 151 and contacts 302 to extend above an upper surface of molding layer 141. Generally, tips 151 may be above or even with contacts 302.

Film assist molding may be used to reveal tips or upper ends 151 of wires 150 for subsequent interconnection with lower bond pads 102. Such film assist molding may be used to reveal upper end surfaces of contacts 302, as well. With upper ends 151 of wires 150 extending above an upper surface 452 of controller 300 as in this example implementation, molding material 215 may be injection deposited. In this or another implementation, a portion of upper ends of wires 150, as well as contacts 302, may be ground or polished back to planarize for physical interconnection with yet to be formed lower bond pads 102.

To recapitulate, for an image sensor device 100 of FIG. 11, substrate 110 may be thinned, which may be before or after formation of channels 140 or mold cavities 140. After thinning, a controller 300 and/or one or more other dies may be attached back side surface down to a back side surface up oriented thinned substrate 110, and, after thinning and formation of channels 140 for mold cavities 140, formation and boding of wire bond wires 150 may be performed. Attachment of controller or image processor die 300 may include using a thermally insulating adhesive 310 to attach controller 300 to a back side surface of a corresponding image sensor die 170 of substrate 110. After attachment of controller 300 and formation of wire bond wires 150, a molding material 215 may be deposited. Such molding material 215 may be deposited into channels 140 to provide mold cavities 140, as well as into controller or die cavities 301 (if present), and along back side surfaces of image sensor dies 170 of substrates 110 and over a front side surface of controller 300. Wire bond wires 150, along with contacts 302 of controller 300, may extend beyond an upper surface of molding layer 141 by use of a film assisted molding and/or by use of a grinding or polishing operation.

At 406, bond pads 102 may be formed over upper ends 151 of wire bond wires 150. An RDL 120 may be formed after formation of bond pads 102. Optionally, bond pads 102 may be formed as part of RDL 120. Again, image sensor die 170 of FIGS. 10 and 11 is in an inverse orientation, which effectively converts lower bond pads 102 to base bond pads. Thus, base bond pads 102 may be generally in a same or common horizontal plane as a back side lower surface of substrate 110, or more particularly image sensor die 170. This allows for a face-up configuration of an image sensor die 170 or a substrate 110 with base or lower bond pads 102 being associated with a back side surface of such face-up oriented substrate 110

An RDL 120 may be formed on molding layer 141, as previously described, but with contacts 302 interconnected through such RDL 120 and bump pads 104 to bumps 101, and such contacts 302 may be coupled to wires 150 for controlling image sensors of image sensor device 100. As lower bond pads 102 may be formed on molding layer 141, and as RDL 120 may be formed on lower bond pads 102, lower bond pads 102 as well as RDL 120 may not come into direct contact with substrate 110, or more particularly an associated image sensor die 170. In an implementation at 406, traces 103 of RDL 120 may be used to couple a perimeter of lower bond pads 102 to bump pads or receptors 104 for interconnection with associated bumps 101. Accordingly, substrate 110, or more particularly an image sensor device 100, may have a front face up orientation with a shorter wiring path to reduce signal propagation delay for operation of such an image sensor device 100.

Optionally, another chip or die may be coupled to RDL 120, generally at a back side of image sensor device 100 to provide a multi-die or multi-chip image sensor module. Such other chip or die may include an image processor.

One or more operations associated with a dielectric boundary, a barrier layer, a seed layer, and a metal plating associated with forming a TSV may be avoided. Having an RDL 120 on one common surface, namely on only mold material of molding layer 141 in this example implementation and on no other material surface, may provide better reliability in comparison to FOWLP, as for example RDL 120 metal is not transitioned between an Si substrate surface, such as of a wafer or substrate 110, and a molding material surface of molding material 215. Furthermore, a CTE of molding material 215, or a combination of molding and/or coating layers, of molding layer 141 may more closely correspond to a PCB material.

Moreover, molding layer 141 may have a larger surface area than substrate 110 for purposes of bump pads 104, namely for purposes of "bumping out". A conventional CMOS image sensor device with TSVs has dimensional restrictions due to locations of such TSVs; however, by avoiding TSVs, these dimensional restrictions may be avoided. Along those lines, more of an edge area around a perimeter of substrate 110 may be etched to make such additional space available for wire bond wires 150 in comparison to TSVs. Along those lines, in another implementation, RDL 120 may extend up (down at operation 206) along sidewalls 220 of substrate 110. In an implementation, RDL 120 may be formed partly on molding layer 141 and partly on substrate 110, like in a FOWLP.

Figure 13:
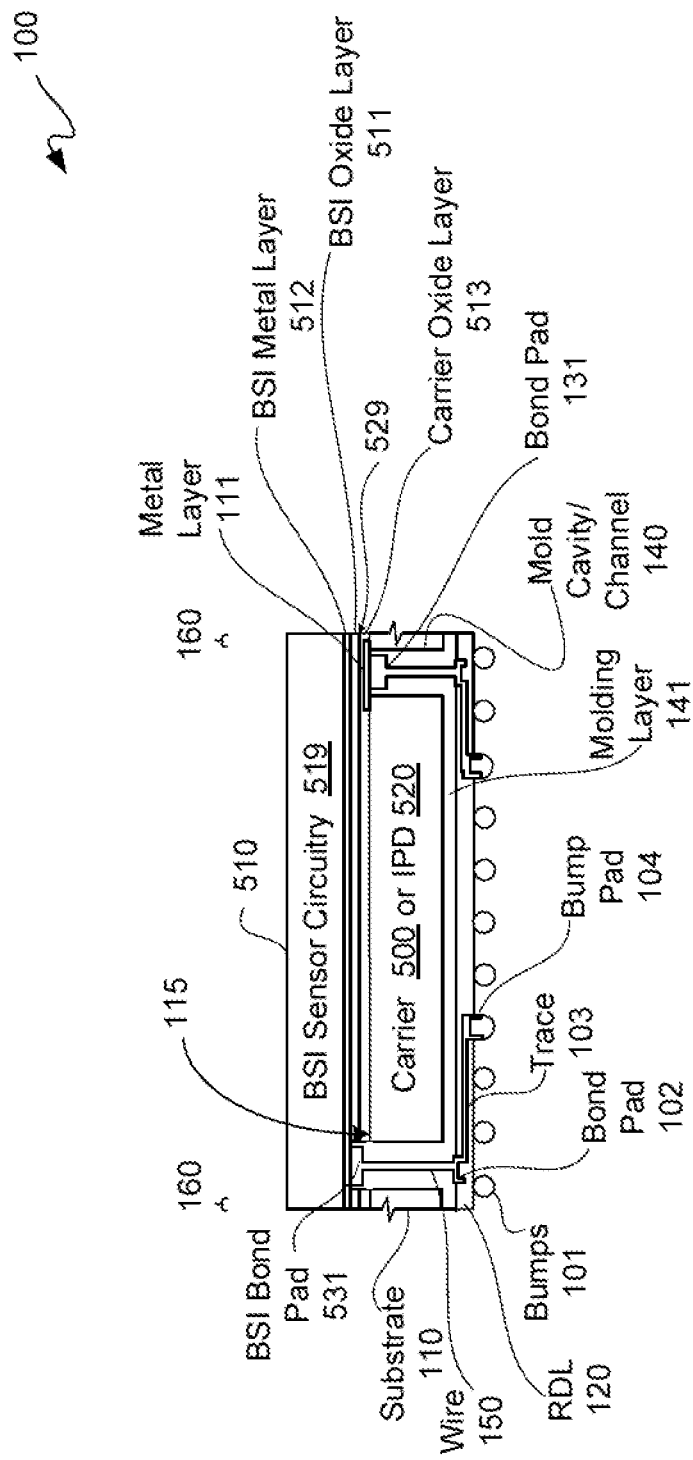
FIGS. 13 through 15 are cross-sectional side views illustratively depicting respective exemplary "back side" image sensor devices with dicing lanes for sensor dies in a substrate.
Figure 14:
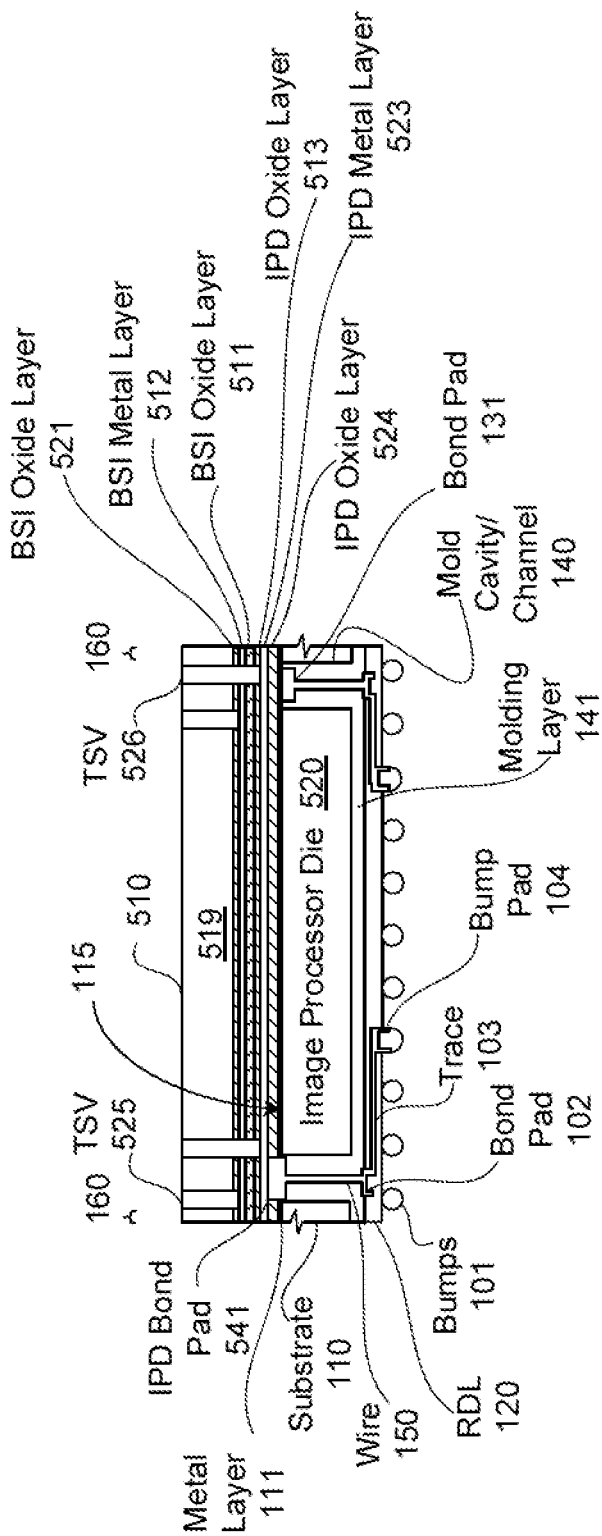
Figure 15:
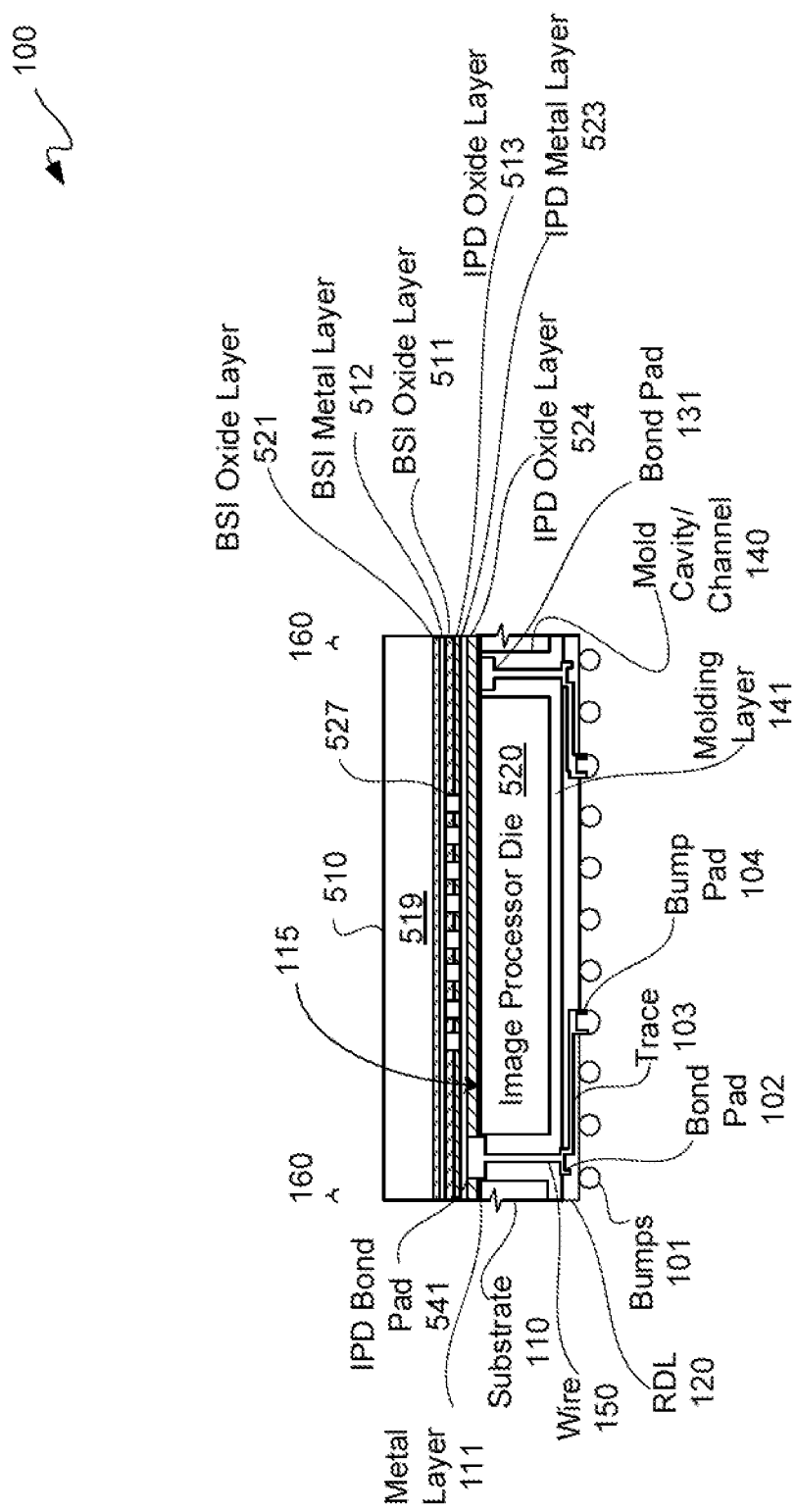

FIGS. 13 through 15 are cross-sectional side views illustratively depicting respective exemplary "back side" image sensor devices 100 with dicing lanes 160. In these exemplary implementations, back side image sensor devices 100 are illustratively depicted. In the exemplary image sensor device 100 of FIG. 13, a substrate 110 is used to provide carriers 500. While carrier 500 may be formed of a semiconductor material, such as Si, GaAs, SiGe, or other form of semiconductor wafer, carriers 500 may be formed of other materials, such as glass or a dielectric material for example.

In contrast, in FIGS. 14 and 15 back side image sensor devices 100 are from a substrate 110 formed of a semiconductor material, such as an Si, GaAs, SiGe, or other form of semiconductor wafer, used to provide image processor dies 520. Though the example herein is generally described in terms of CMOS image processor dies 520, other types of image processor dies may be used.

With reference to FIG. 13, a back side image sensor die ("BSI sensor") 510 is coupled to a substrate 110, where carriers 500, or image processor dies ("IPDs") 520, are formed from such substrate 110. Even though a BSI sensor 510 is described herein, another type of image sensor may be used in other implementations. Moreover, even though the term "die" is used throughout herein, it should be understood that a die may be in a wafer or other substrate having multiple dies. Thus, the term "die" should not be construed to be limited to only after dicing a wafer or substrate, but may include a die yet to be diced.

For purposes of clarity by way of example and not limitation, it shall be assumed that carriers 500 are formed of substrate 110, which may be a wafer. However, in another implementation, IPDs 520 may be formed of substrate 110. As many of the components of image sensor devices 100 of FIGS. 7 and 13 are the same or similar, description of those components is generally not repeated below for purposes of clarity and not limitation.

BSI sensor 510 may include BSI bond pads 531 coupled to a BSI metal layer 512, which may be coupled to BSI sensor circuitry 519. A BSI oxide or other dielectric layer 511 of BSI sensor 510 may be on a side ("underside") of BSI sensor 510. A carrier oxide or other dielectric layer 513 may be deposited on and/or grown from an upper surface 115 of substrate 110.

BSI bond pads 531 of BSI sensor 510 may at least be partially in BSI oxide layer 511 and are in channel 140. Bond pads 131 may be formed as previously described.

A BSI oxide layer 511 to carrier oxide layer 513 interface may be an oxide-to-oxide bond interface 529 for coupling BSI sensor 510 and substrate 110 to one another. Along those lines, this coupling may be done as a wafer-to-wafer coupling for subsequent dicing via dicing lanes 160. Again, though an oxide-to-oxide interface is described in this example, in another example another type of dielectric-to-dielectric interface may be used, which may or may not include an oxide layer.

After coupling BSI sensor 510 and substrate 110 to one another, channels 140 may be etched or drilled using a stop on metal etch to reveal BSI bond pads 531, as well as bond pads 131. Along those lines, metal layer 111 may have openings therein for allowing etching through into oxide layers 511 and 513 to reveal BSI bond pads 531, which may further stop on BSI metal layer 512. Wire bonds of wire bond wires 150 may then be bonded on bond pads 131 and 531 in channels 140, as previously described. Accordingly, channels 140 may be through substrate 110 channels extending at least between front and back side surfaces thereof.

Image sensor devices 100 of FIGS. 13 through 15 may be formed as generally described with reference to exemplary process flow 200 of FIG. 9. Generally, an image sensor 510 may be coupled to substrate 110, such as with an oxide-to-oxide bond for example as described herein. Such image sensor 510 and substrate 110 combination may then be drilled or generally anisotropically etched through substrate 110 and then through oxide layers 513 and 511 with a stop on metal layer 512 for BSI bond pads 531 of FIG. 13. For image sensor devices 100 of FIGS. 14 and 15, such anisotropic etching or drilling is likewise through substrate 110, and then through a dielectric layer 524 for a stop on metal layer 523. Of course chemistries may be changed, including changed in situ, for such etching or drilling to account for etching or drilling different materials. Moreover, even though etching or drilling may be used exclusively, in another implementation a combination of drilling then etching, or vice versa, may be used to form channels 140.

With reference to FIG. 14, a BSI sensor 510 is coupled to a substrate 110, where IPDs 520 are formed from such substrate 110. As many of the components of image sensor devices 100 of FIGS. 7 and 14 are the same or similar, description of those components is generally not repeated below for purposes of clarity and not limitation.

Image processor die ("IPD") 520 may include IPD bond pads 541. IPD bond pads 541 may be coupled to either or both of an IPD metal layer 523 or a metal layer 111. An IPD oxide or other dielectric layer 524 may be formed on metal layer 111, and metal layer 111 may be coupled to IPD circuitry of IPD 520.

An IPD bond pad 541 may be coupled to or formed as part of metal layer 111. IPD bond pad 541 may be at least partially in IPD oxide layer 524. IPD bond pad 541 may be coupled for electrical conductivity with an IPD metal layer 523, and IPD metal layer 523 may be formed on IPD oxide layer 524. IPD oxide layer 513 may be deposited on IPD metal layer 523.

A BSI oxide layer 511 of BSI sensor 510 may be on an underside of BSI sensor 510. Bond pads 131 may be formed as previously described.

BSI sensor 510 may include a BSI metal layer 512 formed between BSI oxide layer 521 and BSI oxide layer 511. A BSI oxide layer 511 to carrier oxide layer 513 interface may be an oxide-to-oxide bond interface, such as previously described, for coupling BSI sensor 510 and substrate 110 to one another. Along those lines, this coupling may be done as a wafer-to-wafer coupling for subsequent dicing via dicing lanes 160.

Moreover, through substrate vias or TSVs 525 and 526 may be respectively interconnected to metal layers 512 and 523. Along those lines, TSVs 526 may go through a substrate of BSI sensor 510 from an upper surface thereof to a lower surface thereof, as well as through IPD oxide layer 513 to IPD metal layer 523. Accordingly, completion of TSVs 526 may be after coupling of BSI sensor 510 and substrate 110 to one another.

After coupling BSI sensor 510 and substrate 110 to one another, channels 140 may be etched or drilled using a stop on metal etch to reveal IPD bond pads 541, as well as bond pads 131. Wire bonds of wire bond wires 150 may then be made on bond pads 131 and 541 in channels 140, as previously described.

With reference to FIG. 15, a BSI sensor 510 is coupled to a substrate 110, where IPDs 520 are formed from such substrate 110. As many of the components of image sensor devices 100 of FIGS. 7, 14 and 15 are the same or similar, description of those components is generally not repeated below for purposes of clarity and not limitation.

IPD 520 may include IPD bond pads 541. IPD bond pads 541 may be coupled to either or both of an IPD metal layer 523 or a metal layer 111. An IPD oxide or other dielectric layer 524 may be formed on metal layer 111, and metal layer 111 may be coupled to IPD circuitry of IPD 520. IPD bond pad 541 may be coupled to or formed as part of metal layer 111. IPD bond pad 541 may be defined, at least in part, in IPD oxide layer 524. IPD bond pad 541 may be coupled for electrical conductivity with an IPD metal layer 523, and IPD metal layer 523 may be formed on IPD oxide layer 524. IPD oxide layer 513 may be deposited on IPD metal layer 523.

A BSI oxide layer 511 of BSI sensor 510 may be on an underside of BSI sensor 510. Bond pads 131 may be formed as previously described.

BSI sensor 510 may include a BSI metal layer 512 formed between BSI oxide layer 521 and BSI oxide layer 511. A BSI oxide layer 511 to carrier oxide layer 513 interface may be an oxide-to-oxide bond interface, such as previously described, for coupling BSI sensor 510 and substrate 110 to one another. Along those lines, this coupling may be done as a wafer-to-wafer coupling for subsequent dicing via dicing lanes 160.

Moreover, metal vias 527 may be respectively interconnected to metal layers 512 and 523. Along those lines, metal vias 527 may go through IPD oxide layer 513 to IPD metal layer 523 and go through BSI oxide layer 511 to BSI metal layer 512. Accordingly, a portion of metal vias 527 may be formed in BSI sensor 510 and another portion of metal vias 527 may be formed in IPD 520, and completion of metal vias 527 may be after coupling of BSI sensor 510 and substrate 110 to one another, which coupling may include a copper-to-copper bonding of corresponding metal via 527 portions to one another.

After coupling BSI sensor 510 and substrate 110 to one another, channels 140 may be etched or drilled using a stop on metal etch to reveal IPD bond pads 541, as well as bond pads 131. Wire bonds of wire bond wires 150 may then be made on bond pads 131 and 541 in channels 140, as previously described.

Figure 16:
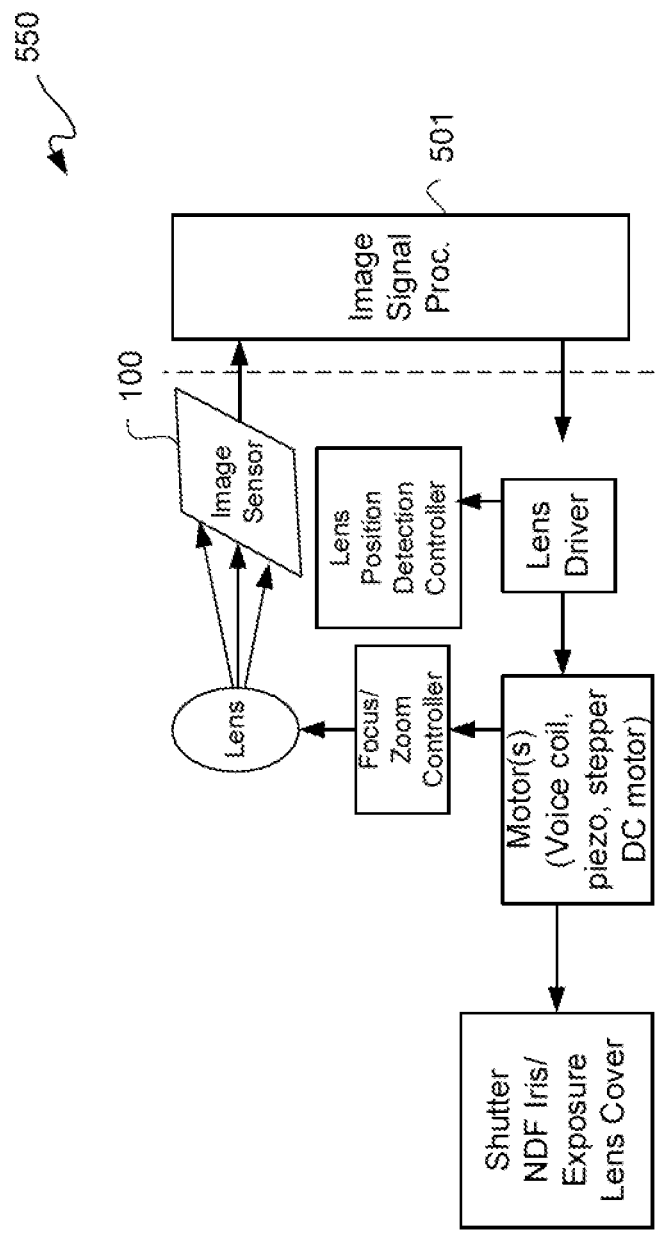
FIG. 16 is a block diagram illustratively depicting an exemplary camera system.

FIG. 16 is a block diagram illustratively depicting an exemplary camera system 550. In camera system 550, an image sensor device 100 is coupled to an image signal processor 501. Other details regarding camera system 550 are well-known, and thus not described for purposes of clarity and not limitation.

FIGS. 17-1 through 17-9 are cross-sectional side views illustratively depicting respective exemplary "back side" image (BSI) sensor devices 100.

Figures 3, 19:
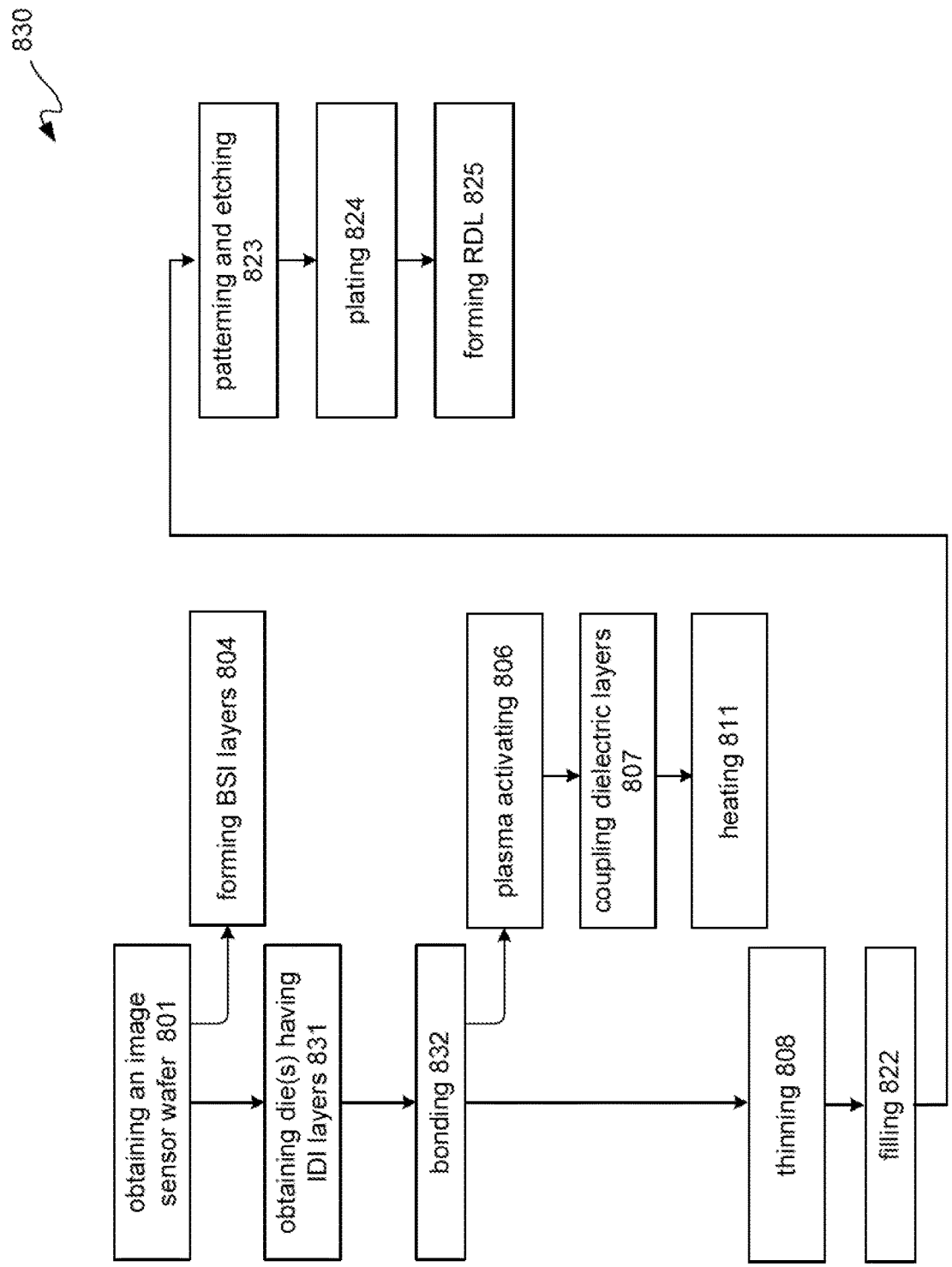

With reference to FIG. 17-1, a wafer-to-wafer ("W2W") assembly 600 of a BSI sensor device 100 is illustratively depicted. BSI sensor device of W2W assembly 600 is further described with simultaneous reference to FIG. 19-1, where there is shown a flow diagram depicting an exemplary assembly flow 800.

At operation 801, an image sensor wafer 610 is obtained. Image sensor wafer 610 includes image sensor dies, such as image sensor die 611 of image sensor wafer 610 for example between dicing lanes 160. Image sensor wafer 610 may have a first diameter, as generally indicated by arrow 612.

At operation 804, if BSI layers 606 are not already present as part of an obtained image sensor wafer 801, BSI layers 606 may be formed layer-by-layer starting on a surface 601 of image sensor wafer 610. In this example, BSI layers 606 include one or two metal layers 605 indicated with cross-hatching and three dielectric layers 604. However, in another example fewer, more, or a same number of dielectric and/or metal layers may be used. In this example, a, which in the depiction is a lowermost, surface of a last dielectric layer 604 of BSI layers 606 opposite image receiving surface 609 may provide a surface for a W2W interface 613, as described below in additional detail.

In this example, image sensor wafer 610 has already been thinned for subsequent use, such as for back side imaging, namely via an image receiving surface 609. Generally, BSI layers 606 may be formed prior to thinning image sensor wafer 610. BSI layers 606 may be formed starting in the depiction from a lowermost surface 601 of image sensor wafer 610 opposite an uppermost or image receiving surface 609 of image sensor wafer 610.

At operation 802, a reconstituted wafer 615 may be obtained. In this example, reconstituted wafer 615 includes a processor die 620 (which may be an image processor die), a memory die or device 621, and generally a control logic ("controller") die 622. However, generally in addition to processor die 620, reconstituted wafer 615 may include one or more functional dies selected from memory dies, controller dies, logic dies, and/or analog dies.

Because image sensor wafer 610 may be separately processed from dies 620 through 622, image sensor wafer 610 may be formed using a substrate or other platform with significantly different dimensions than a wafer substrate used to form dies 620 through 622. For example, image sensor wafer 610 may be of a first diameter associated with formation of image sensing arrays, and processor die 620 may be from a processor wafer of a second diameter different from such first diameter. For clarity by way of non-limiting example, a processor wafer may be a 300 mm diameter wafer, and image sensor wafer 610 may be a 200 mm diameter wafer, or vice versa.

Processor die 620 may be located side-by-side 617 memory die 621 with a gap or offset 618 therebetween for a generally planar topology with reference to an uppermost surface 608 of reconstituted wafer 615. Offset 618 may be less than or equal to one micron.

Similarly, controller die 622 may be located side-by-side 617 memory die 621 with a gap or offset 618 therebetween for a generally planar topology of upper surfaces of dies 620 through 622 with reference to and forming a portion of an uppermost surface 608 of reconstituted wafer 615.

Another portion of uppermost surface 608 may be formed with molding material 619. In this example, a molding material 619 may be injected into a mold with dies 620 through 622 therein for forming a reconstituted wafer 615.

While memory die 621 is generally referenced as a memory die 621 herein, a dashed line thereof is used to indicate that memory die 621 may be a stack of memory dies. For purposes of clarity and not limitation, memory die 621 is referred to herein to be a single memory die or a stack of memory dies.

At operation 805, if reconstituted wafer interface ("RWI") layers 607 are not already present as part of a reconstituted wafer 615, RWI layers 607 may be formed layer-by-layer starting on a surface 608 of reconstituted wafer 615. In this example, RWI layers 607 include one or two metal layers 603 indicated with cross-hatching and three dielectric layers 602. However, in another example fewer, more, or a same number of dielectric and/or metal layers may be used. In this example, a, which in the depiction is an uppermost, surface of a last dielectric layer 602 facing and contacting a last or lowermost surface of a last dielectric layer 604 may provide a W2W interface surface 613, as described below in additional detail.

RWI layers 607 may be formed starting from an uppermost surface 608 of reconstituted wafer 615 opposite a lowermost surface 624 of reconstituted wafer 615. At operation 803, reconstituted wafer 615 and image sensor wafer 610 are bonded to one another.

Along those lines, as part of and prior to actual bonding at operation 803, at operation 806 at least one surface of a lowermost surface of a last dielectric layer 604 of BSI layers 606 or an uppermost surface of a last dielectric layer 602 of RWI layers 607 may be plasma activated for subsequent coupling of such wafers to one another to form interface 613.

For purposes of clarity by way of example and not limitation, dielectric surfaces, such as silicon oxide, silicon carbide nitride, or the like may be polished to low surface roughness, such as using chemical-mechanical polishing (CMP), for "spontaneous" bonding, and nitrogen-based chemistries may be applied through plasma etch processing to plasma activate such one or more surfaces. Such prepared one or more wafer surfaces may then be aligned and placed together, resulting in a "spontaneous" formation of chemical bonds between such wafers. As described below in additional detail, die-to-die ("D2D") or die-to-wafer ("D2W") bonds may likewise be formed. Such bonds may be a strong, low distortion chemical bond. Such bonds may have a bond strength about half the strength of silicon and can be obtained at room temperature. Moreover, a reliable hermetic bond, stronger than silicon, can be obtained after moderate heating, such as to about 150 Celsius, for example. Such an anneal may be performed in batch processing, namely apart from an alignment and placement tool.

At operation 807, such one or more plasma activated surfaces may be placed in contact with one another for coupling. More particularly, at operation 807 of operation 803, a lowermost surface of a last dielectric layer 604 of BSI layers 606 may be coupled to an uppermost surface of a last dielectric layer 602 of RWI layers 607 to form a chemical bond interface 613, namely coupling such wafers to one another by direct bonding at room temperature for a wafer-to-wafer adhesiveless bonding.

Figures 1, 18:
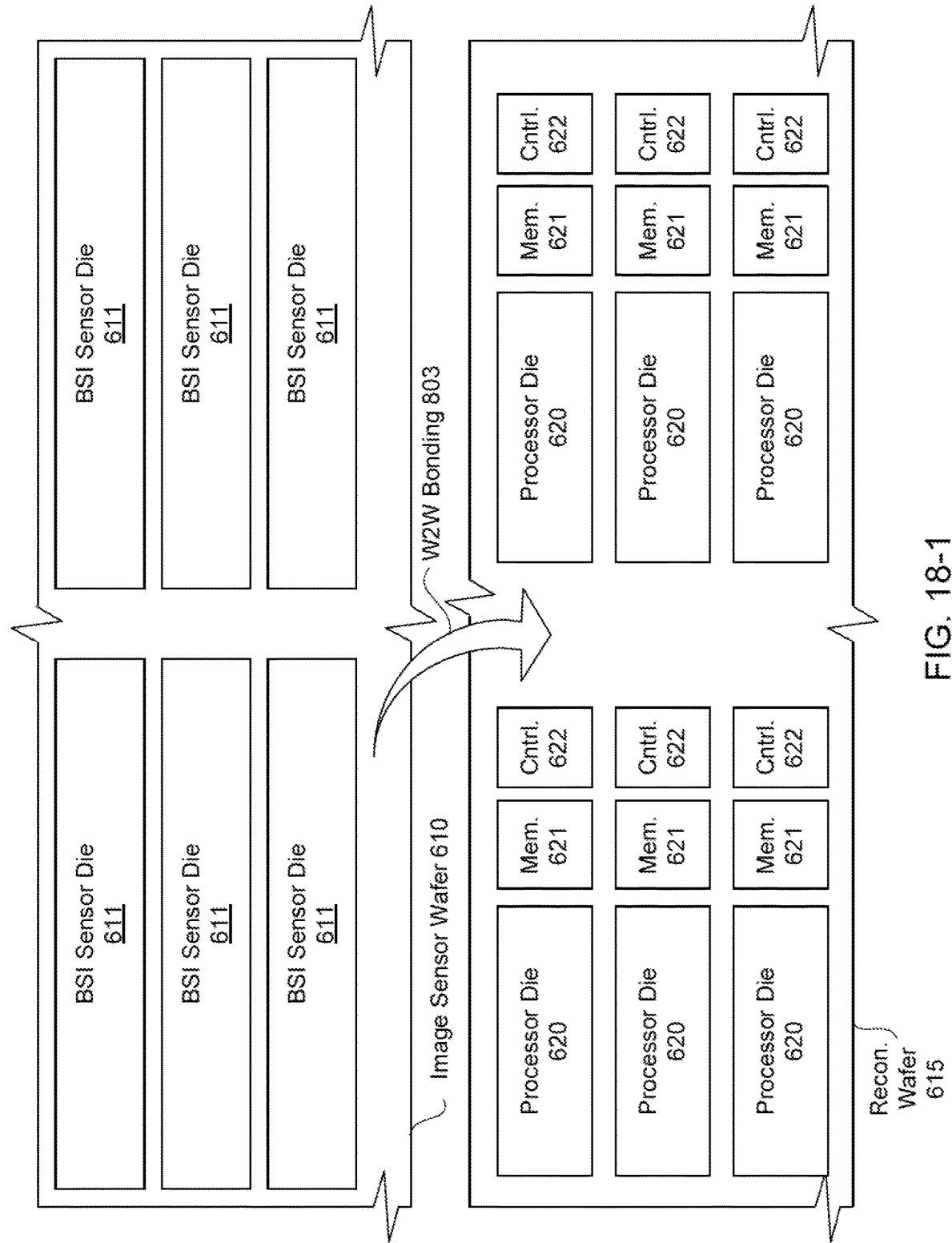
Figures 2, 18:
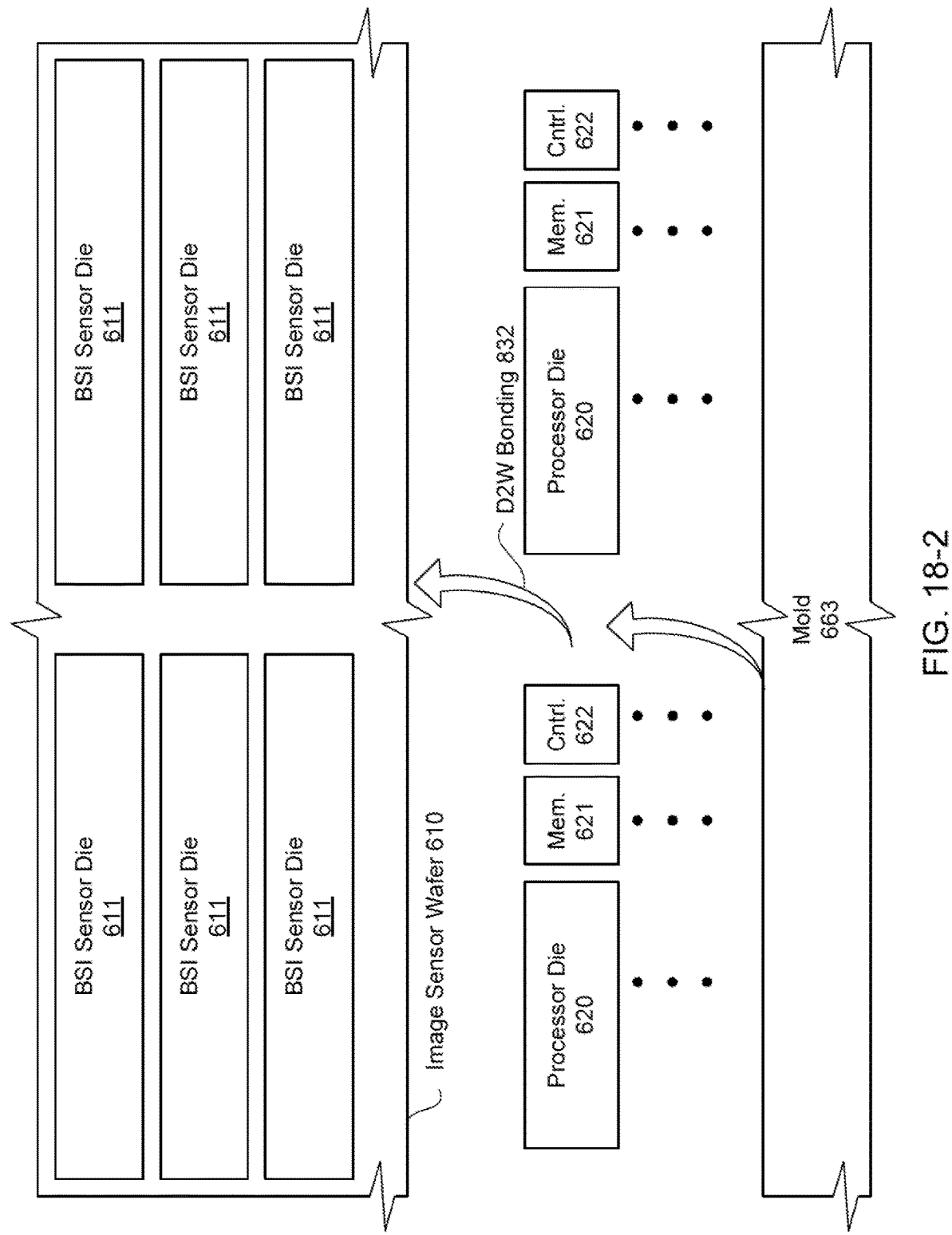
Figures 3, 18:
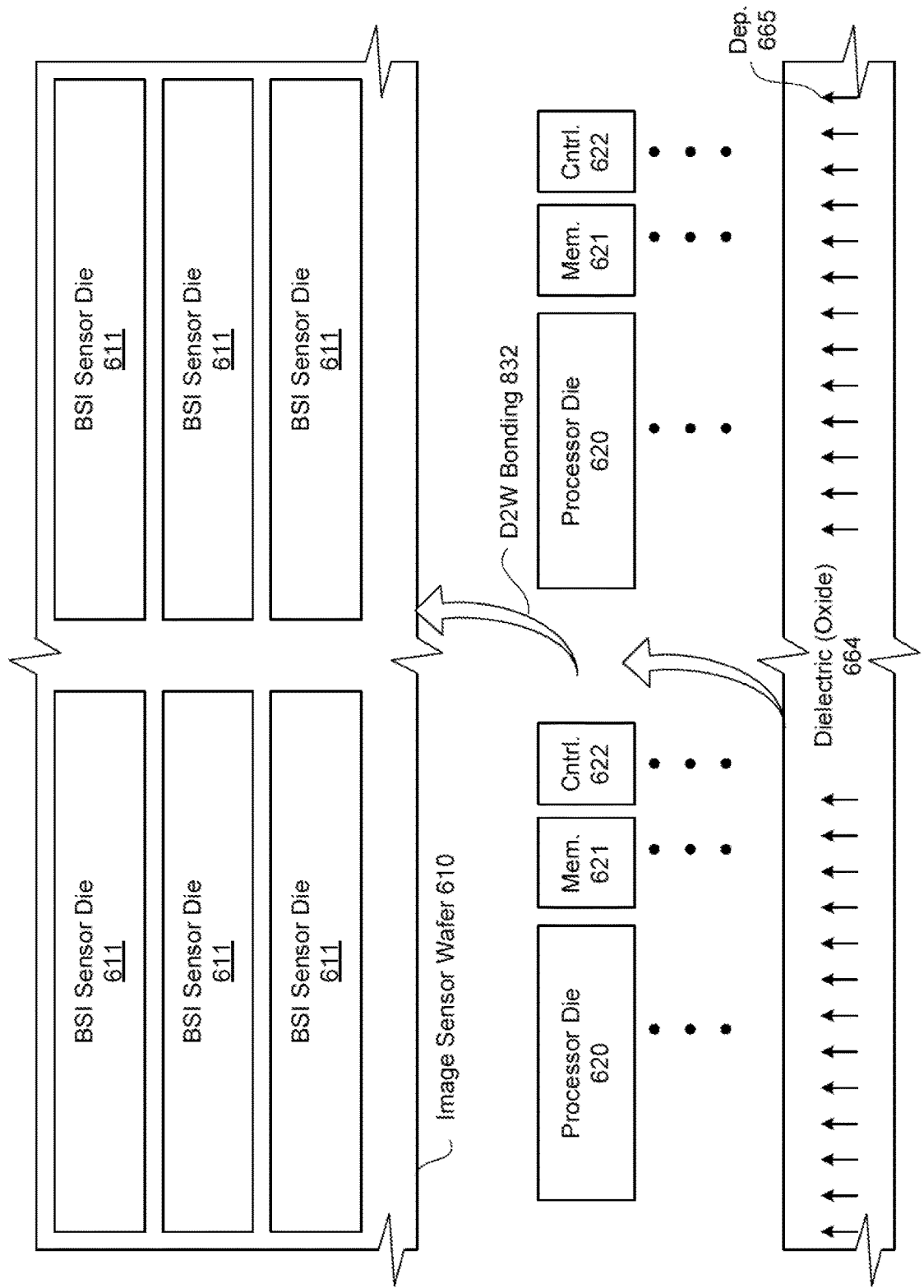
Figures 4, 18:
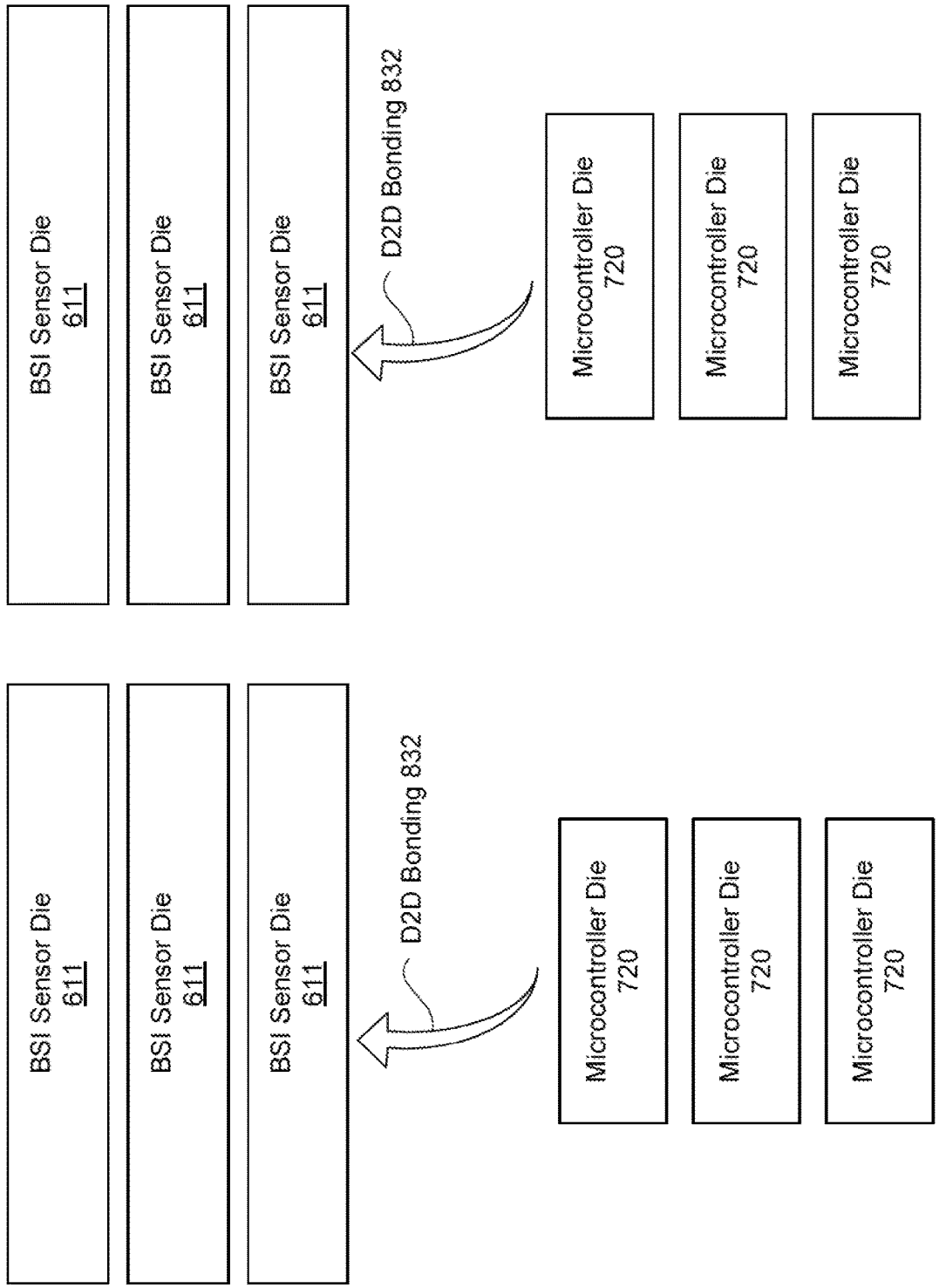
Figures 5, 18:
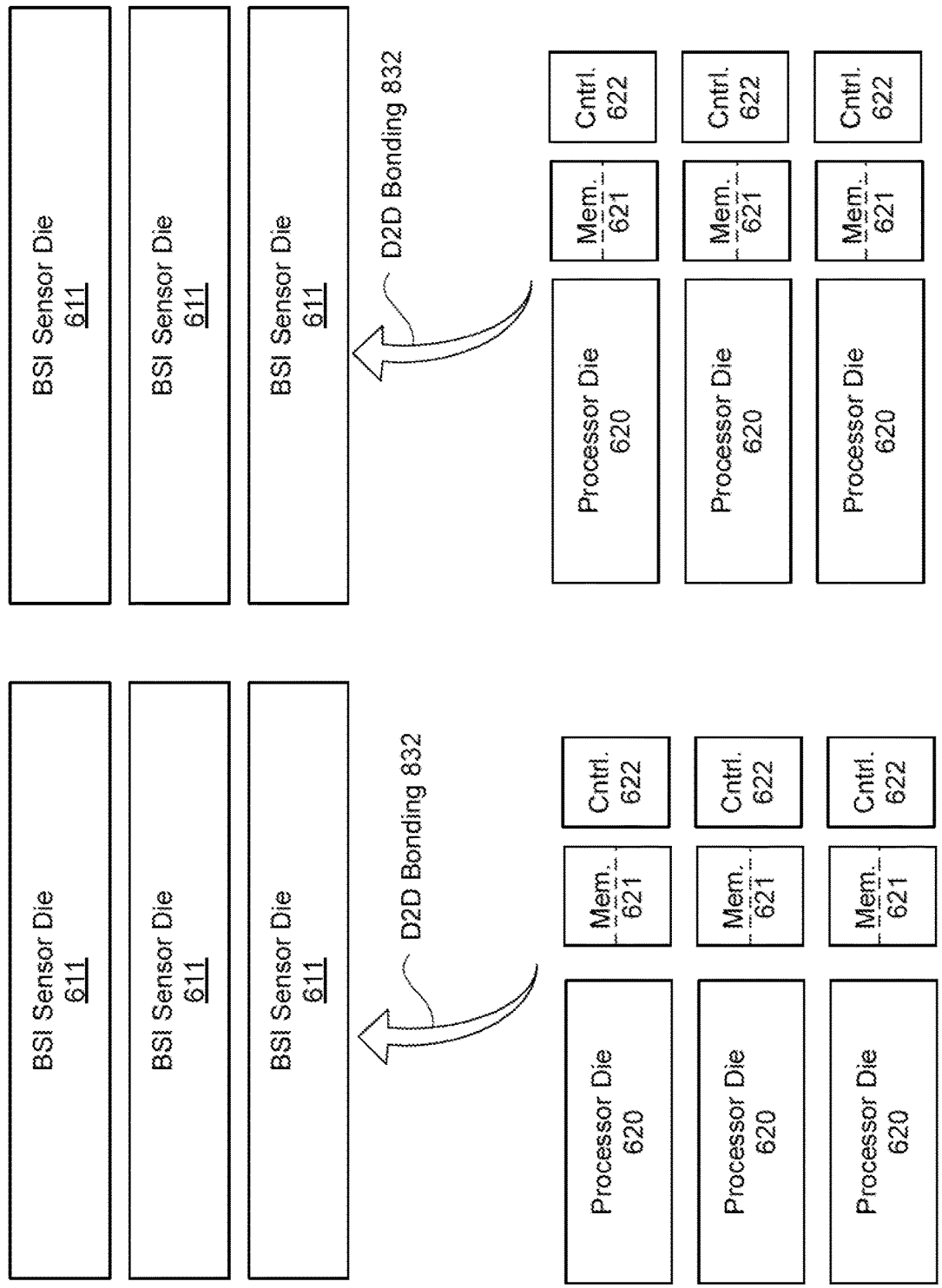

Along those lines, with additional reference to FIG. 18-1, where there is shown a block diagram illustratively depicting an example of a W2W bonding operation 803, an image sensor wafer 610 having BSI sensor dies 611 may have each of such dies coupled to a set of dies 620 through 622 of a reconstituted wafer 615. Reconstituted wafer 615 may include sets of dies 620 through 622 corresponding to BSI sensor dies 611 of image sensor wafer 610.

Optionally, formation of BSI layers at operation 804 and formation of RWI layers at operation 805 may respectively include formation of metallic pads in interfacing dielectric layers 602 and 604. Along those lines, an optional heating, such as annealing, operation 811 may be performed. Formation of metallic pads and optional heating operation 811 is described below in additional detail. Furthermore, an optional heating operation 811 may include or consist of a low temperature anneal to provide a hermetic seal.

After coupling wafers 610 and 615 to one another, at operation 808 a back side, namely along surface 609, of image sensor wafer 610 may be back surface ground to provide back-side thinning to reduce thickness of image sensor wafer 610. While image sensor wafer 610 may be thinned prior to coupling with wafer 615, a thicker assembly may allow thinning at operation 808 to be more reliable, namely less of a possibility of warpage than thinning prior to such coupling.

After thinning at operation 808, conductive vias may be formed at operation 809. In this example, a set of conductive vias 616 are formed to generally extend from an upper surface 609 to a lower surface 608. This set of conductive vias 616 may be for interconnecting for electrical conductivity to processor die 620, such as for power, ground and/or signaling. This set of conductive vias 616 pass through image sensor wafer 610, dielectric layers 604 and dielectric layers 602 as one continuous piece of metal. A continuous piece of metal, in contrast to a stack of metal layers, may at a granular level provide for direct electrical conductivity with less interface resistivity for electrical communication with processor die 620.

Further, in this example, another set of conductive vias 623, which may be formed at operation 809, are formed to generally extend from an upper surface 609 to a surface of a metal layer 603 of metal layers of RWI layers 607. These conductive vias 623 may have same and/or different depths. These conductive vias 623 may go through image sensor wafer 610, dielectric layers 604 of BSI layers 606, and one or more, but not all, of dielectric layers 602 of RWI layers

607 as a continuous piece of metal. Conductive vias 623 may be for interconnecting power, ground, and/or signaling for circuitry of dies 621 and/or 622.

In the above-mentioned example, another set of conductive vias 629 which may be formed at operation 809, may be formed to generally extend from an upper surface 609 to a surface of a metal layer 605 of metal layers of BSI layers 606. These conductive vias 629 may have same and/or different depths. These conductive vias 629 may go through image sensor wafer 610, dielectric layers 604 of BSI layers 606, and none of dielectric layers 602 of RWI layers 607 as a continuous piece of metal. Conductive vias 629 may be for interconnecting power, ground, and/or signaling for circuitry of dies 620, 621, and/or 622.

Further still, in the above-mentioned example, yet another set of conductive vias 626, which may be formed at operation 809, may be formed to generally extend from an upper surface 609 to a surface of a metal layer 605 of metal layers of BSI layers 606. These conductive vias 626 may have same and/or different depths. These conductive vias 626 may go through image sensor wafer 610 and one or more, but not all, of dielectric layers 604 of BSI layers 606 as a continuous piece of metal. Conductive vias 626 may be for interconnecting power, ground, and/or signaling for electrical conductivity with circuitry of image sensor wafer 610.

Conductive vias 616, 623, 626, and 629 may be along a periphery of an array of image sensors of an image sensor die 611 of image sensor wafer 610. Some examples of metal lines of layers 606 and 607, as well as conductive vias 616, 623, 626, and 629, are illustratively depicted for purposes of clarity and not limitation. Along those lines, there may be many more power, ground and signal lines used in an implementation. Furthermore, not all conductive vias need to be along a periphery of an array of image sensors of an image sensor die 611.

At operation 810, interconnects to upper ends of conductive vias 616, 623, 626, and 629 may be formed. In this example, such interconnects are wire bond wires 606 wire bonded with ball bonds 614 to such upper ends of conductive vias 616, 623, 626, and 629. However, in other examples, other types of wire bonds may be used.

With reference to FIG. 17-2, another W2W assembly 600 of a BSI sensor device 100 is illustratively depicted. W2W assembly 600 of BSI sensor device 100 of FIG. 17-2 is further described with simultaneous reference to FIG. 19-1, where there is shown a flow diagram depicting an exemplary assembly flow 800.

W2W assembly 600 of FIG. 17-2 is the same as of FIG. 17-1, except for the following differences. Rather than forming wire bonds at operation 810, at operation 810 interconnects to upper ends of conductive vias 616, 623, 626, and 629 may be formed in this example as conductive pads 627. In this example, such interconnects include conductive pads 627 on such upper ends of conductive vias 616, 623, 626, and 629 with solder bumps, micro pillars or stud bumps 628 respectively on such conductive pads.

With reference to FIG. 17-3, yet another W2W assembly 600 of a BSI sensor device 100 is illustratively depicted. W2W assembly 600 of BSI sensor device 100 of FIG. 17-3 is further described with simultaneous reference to FIG. 19-1, where there is shown a flow diagram depicting an exemplary assembly flow 800.

W2W assembly 600 of FIG. 17-3 is the same as of FIG. 17-1, except for the following differences. Rather than forming interfacing dielectric layers 602 and 604 to provide an interface 613, where each of such dielectric layers when coupling together have no metal layer therein, interfacing dielectric layers 602 and 604 respectively include a metal layer 605 and a metal layer 603.

In this example, each of dielectric layers 604 of BSI layers 606 includes a plurality of metallic pads 631, and each of dielectric layers 602 of RWI layers 607 includes a plurality of metallic pads 631. Metallic pads 631 of dielectric layers 602 and 604 may be vertically aligned to one another to form one or more conductive via stacks 633. Conductive via stacks, sometimes referred to as "chimney stacks" may be distinguished from continuous conductive vias formed by plating or filling a hole to provide a more continuous piece of metal at a granular level, such as may be determined with reference to grain boundaries.

For purposes of clarity by way of non-limiting example, a partial stack 634 of metallic pads 631 of dielectric layers 602 may be vertically aligned to a corresponding partial stack 635 of metallic pads 631 of dielectric layers 604. When interfacing surfaces of partial stacks 634 and 635 are interconnected to one another for electrical conductivity, a conductive via stack 633 may be provided.

Conductive via stacks 633 may be used for electrical communication between for example processor die 620 and circuitry of an image sensor die of image sensor wafer 610. However, conductive via stacks 633 may be used for other electrical communication, such as to or from memory die 621 and/or controller 622 for example.

Along those lines, in this example, shown in more detail in an enlarged portion 640, lower surfaces 638 of a plurality of metallic pads 631 may be along an interfacing surface 641 of interface 613 provided by a metal layer 605 and a dielectric layer 604 of BSI layers 606. Same or similarly, in this example as shown in detail in enlarged portion 640, upper surfaces 637 of a plurality of metallic pads 631 may be along an interfacing surface 641 of interface 613 provided by a metal layer 603 and a dielectric layer 602 of RWI layers 607. Surfaces 638 and corresponding surfaces 637 of facing metallic pads 631 may be directly interconnected to one another for electrical connectivity.

In hybrid direct bonding, for W2W, D2W, or D2D, room temperature bonding may be performed without any pressure or adhesive. During processing, dielectric surfaces, such as for example silicon oxide, silicon nitride, silicon oxynitride and silicon carbide nitride, with embedded metal bond pads, such as of copper or nickel, may be polished along with a corresponding dielectric surface to achieve a low surface roughness. Simultaneously, such metal bond pads may be slightly dished. Polishing and dishing may be achieved using chemical mechanical polishing (CMP). Plasma activation, such as for example with nitrogen-based chemistries, may then be applied using plasma etch tools. Prepared wafers and/or dies can then be aligned and placed together resulting in spontaneous formation of strong chemical bonds between such prepared surfaces. After a batch anneal at operation 811, metal bond pads may expand into one another to form a homogeneous metallic interconnect with grain growth across a bond interface 613. Such a chemical bond between oxides may be significantly strengthened by such an anneal forming metallic interconnects, ensuring high reliability without having to use an underfill.

Because metallic interconnects are formed along interface 613, fewer conductive vias may be formed. In the example of FIG. 17-3, only conductive vias 616 are used. However, conductive vias 616 and/or other types of conductive vias may be used in other examples.

With reference to FIG. 17-4, still yet another W2W assembly 600 of a BSI sensor device 100 is illustratively depicted. W2W assembly 600 of BSI sensor device 100 of FIG. 17-4 is further described with simultaneous reference to FIG. 19-1, where there is shown a flow diagram depicting an exemplary assembly flow 800.

W2W assembly 600 of FIG. 17-4 is the same as of FIG. 17-3, except for the following differences. Rather than forming conductive vias 616 or 623, conductive vias 626 may be formed with underlying conductive via stacks 633 or other underlying one or more metal layers of metal layers 605 and/or 603 of layers 606 and/or 607. This allows shallower holes to be formed, as well as having less depth for lining/plating or otherwise processing such holes to form conductive vias 626. However, in another example, a combination of conductive vias 616, 623, 626, and/or 629 may be used.

Another difference is rather than forming wire bonds at operation 810, at operation 810 interconnects to upper ends of conductive vias 616 may be formed in this example as conductive pads 627. In this example, such interconnects include conductive pads 627 on such upper ends of conductive vias 626; however, in another example upper ends of any combination of conductive vias 616, 623, 626, and/or 629 with solder bumps 628 respectively on such conductive pads may be used.

In the above W2W assemblies 600, image sensor wafer 610 may be of a same or different diameter than that used for formation of any of dies 620 through 622. This flexibility, in contrast to a conventional homogenous-to-homogenous W2W bonding, does not waste as much semiconductor area ("semiconductor real estate"). Along those lines, conventionally for purposes of clarity by way of example, image sensor wafers 610 may be 200 mm diameter wafers, and image sensor dies of such image sensor wafers 610 may be larger in surface area than image processor dies 620, memory dies 621, or controller dies 622, or a combination of horizontal surface areas thereof. Furthermore, dies 620, 621, and/or 622 may be formed on respective 300 mm diameter wafers. Therefore, by using a heterogeneous reconstituted wafer 615, less semiconductor wafer real estate may be wasted due to W2W interfacing of differently dimensioned wafers.

With reference to FIG. 17-5, an example of a D2W assembly 700 of a BSI sensor device 100 is illustratively depicted. D2W assembly 700 of BSI sensor device 100 of FIG. 17-5 is further described with simultaneous reference to FIG. 19-2, where there is shown a flow diagram depicting an exemplary assembly flow 820.

Operations 801 and 804 are as previously described, and thus not repeated. At operation 821, one or more dies may be obtained, such as processor die 620, memory die 621, and controller die 622 for example, and attached to a surface of a lower dielectric layer of BSI layers 606 with a bonding layer 701, such for example an adhesive. Gaps or offsets between sides of such dies, such as previously described, may be present to provide a generally planar topology to an interface 702, namely on at least an upper side of such assemblage of dies. In another example, rather than an adhesive, processor die 620, memory die 621, and/or controller die 622 may have a dielectric layer for a bonding layer 701, where such dielectric layer for example of such processor die 620 has a surface which may or may not be plasma activated for adhesiveless direct bonding as previously described herein and not repeated here for clarity. Such dielectric bonding layer 701 surface of processor die 620 may be put in direct contact with a surface of dielectric layer 604 for formation of an interface 702, where another dielectric layer 744 of processor die 620 on an opposite side of processor die 620 with respect to dielectric bonding layer 701 may having metallic pads 745 for interconnection to an RDL 120.

At operation 822, a bottom-side of such assemblage of dies may be filled, including spacing between and alongside such dies, with a mold material 619, or a dielectric fill (e.g., a deposited oxide), or a dielectric encapsulation material.

In this example, holes 703 are formed in molding material 619 at a patterning and etching operation 823, followed by plating of such holes 703 at operation 824 to form conductive vias 705. Removal of excess plating may be performed as part of plating operation 824.

In another example, conductive pillars 705 may be formed prior to filling with a molding material 619. For example, a resist may be deposited, patterned and etched at operation 823 to form holes in such resist. Then, a plating operation 824 may be performed, including removing excess plating material and removal of such resist. Then a filling operation 822 may be performed to have plated conductive pillars 705.

In this example, holes 703 for conductive vias 705 are etched down through a dielectric layer 604 of dielectric layers of BSI layers 606. However, in another example, holes 703 may be etched down to a metal layer (i.e., stop on metal etch) in such dielectric layer 604, and thus not be etched through any dielectric layer 604.

At operation 825, an RDL 120, as previously described, may be formed. RDL 120 may provide electrical interconnects to conductive vias 705 and contacts of one or more of dies 620 through 622, and RDL 120 may be for an FO-WLP topology.

With reference to FIG. 17-6, an example of a D2W assembly 700 of a BSI sensor device 100 is illustratively depicted. D2W assembly 700 of BSI sensor device 100 of FIG. 17-6 is further described with simultaneous reference to FIG. 19-3, where there is shown a flow diagram depicting an exemplary assembly flow 830.

Operations 801 and 804 are as previously described, and thus not repeated. At operation 831, one or more dies may be obtained, such as processor die 620, memory die 621, and controller die 622 for example, where such dies have IDI layers 607.

At operation 832, such one or more dies obtained at operation 831 may be bonded to an image sensor wafer 610 obtained at operation 801. In this example, each of dies 620 through 622 includes individual die interface ("IDI") layers 607, namely the same as RWI layers 607 but without using a reconstituted wafer. Along those lines, IWI layers 607 may include a metal layer 603 and a dielectric layer 602. For example, metal layer 603 provides a plurality of metallic pads 631 in dielectric layer 602 of processor die 620.

Bonding of dielectric layer 602 and metallic pads 631 of IDI layers 607 to a dielectric layer 604 and corresponding metallic pads of such dielectric layer 604 of a metal layer 605 of BSI layers 606 may be performed as previously described for a W2W bonding, such as may include a plasma activating operation for activating one or more dielectric layer surfaces for an interface 706 and coupling, such as described with reference to operations 806 and 807 for example. Furthermore, an anneal or heating operation 811 may be performed as previously described. Optionally, a conductive via 626 for example may be formed through image sensor wafer 610 through to a metal layer of BSI layers 606.

Gaps or offsets between sides of such dies, such as previously described, may be present to provide a generally planar topology to an interface 706, namely on at least an upper side of such assemblage of dies.

Along those lines, with additional reference to FIG. 18-2, where there is shown a block diagram illustratively depicting an example of a D2W bonding operation 832, and image sensor wafer 610 having BSI sensor dies 611 may have each of such dies coupled to a set of dies 620 through 622. Such sets of dies 620 through 622 may be put in a mold 633 for molding with molding material 619. Such molded dies may include sets of dies 620 through 622 corresponding to BSI sensor dies 611 of image sensor wafer 610.

In another example along those lines, with additional reference to FIG. 18-3, where there is shown a block diagram illustratively depicting another example of a D2W bonding operation 832, and image sensor wafer 610 having BSI sensor dies 611 may have each of such dies coupled to a set of dies 620 through 622. Such sets of dies 620 through 622 may be put have a dielectric, such as an oxide, 664 deposited thereon through a deposition operation 665, as is known. Such dielectric-bound dies may include sets of dies 620 through 622 corresponding to BSI sensor dies 611 of image sensor wafer 610.

A thinning operation of image sensor wafer 610 may be performed, as previously described such as with CMP or other thinning operation, at operation 808.

As previously described, at operation 822, a bottom-side of such assemblage of dies 620 through 622 to an image sensor wafer may be filled, including spacing between and alongside such dies, with a mold material 619, or a dielectric fill (e.g., a deposited oxide), or a dielectric encapsulation material.

In this example, holes 703 are formed in molding material 619 at a patterning and etching operation 823, followed by plating of such holes 703 at operation 824 to form conductive vias 705. Removal of excess plating may be performed as part of plating operation 824.

In another example, conductive pillars 705 may be formed prior to filling with a molding material 619. For example, a resist may be deposited, patterned and etched at operation 823 to form holes in such resist. Then, a plating operation 824 may be performed, including removing excess plating material and removal of such resist. Then a filling operation 822 may be performed to have plated conductive pillars 705. Plated conductive pillars 705 in this example may be for fan-out, wafer-level packaging or FO-WLP.

In this example, holes 703 for conductive vias 705 are etched down to a dielectric layer 604 to stop on a metallic pad a metal layer 605 of BSI layers 606. However, in another example, holes 703 may be etched down through a dielectric layer 604 to a metal layer 605.

At operation 825, an RDL 120, as previously described, may be formed for providing electrical interconnects to conductive vias 705. In the example of FIG. 17-5, dies 620 through 622 are all oriented facing in a downward direction with externally accessible contacts thereof facing away from image sensor wafer 610. However, in the example of FIG. 17-6, dies 620 through 622 are all oriented facing in an upward direction with externally accessible contacts thereof facing image sensor wafer 610.

With reference to FIG. 17-7, another example of a D2W assembly 700 of a BSI sensor device 100 is illustratively depicted. D2W assembly 700 of BSI sensor device 100 of FIG. 17-7 is the same as that of FIG. 17-6, except for the following differences.

Rather than a plurality of dies 620 through 622, a single die 720 having IDI layers 607 is coupled to BSI layers 606, such as described above with reference to FIG. 19-3 through for a single die. A single die 720 allows a single platform for forming IDI layers 607. Otherwise, assembly flow 830 is as previously described.

In this example, single die 720 may be a microcontroller die or a microprocessor die having one or more processor cores, memory and controller circuitry. In another example, single die 720 may be a System-on-Chip (SoC) or other Very Large Scale Integration (VLSI) die. Along those lines, with additional reference to FIG. 18-4, where there is shown a block diagram illustratively depicting an example of a D2D bonding operation 832, and BSI sensor dies 611 may each be coupled to a corresponding singulated die, which in this example is a microcontroller die 720.

With reference to FIG. 17-8, an example of a D2D assembly 750 of a BSI sensor device 100 is illustratively depicted. D2D assembly 750 of BSI sensor device 100 of FIG. 17-8 is the same as D2W assembly 700 of FIG. 17-7, except for the following differences.

Rather than an image sensor wafer 610 having multiple image sensor dies, a diced or singulated image sensor die 611 is obtained and used. Accordingly, operations of assembly flow 830 are as previously described with reference to FIG. 19-3, except at operation 801 rather than obtaining an image senor wafer 610 an image sensor die 611 already having BSI layers 606 may be obtained. Accordingly, operation 804 may be omitted, and operation 831, as previously described, may be for a single die 720 having IDI layers 607.

With reference to FIG. 17-9, another example of a D2D assembly 750 of a BSI sensor device 100 is illustratively depicted. D2D assembly 750 of BSI sensor device 100 of FIG. 17-9 is the same as D2W assembly 700 of FIG. 17-6, except for the following differences.

Rather than an image sensor wafer 610 having multiple image sensor dies, a diced or singulated image sensor die 611 is obtained and used. Accordingly, operations of assembly flow 830 are as previously described with reference to FIG. 19-3, except at operation 801 rather than obtaining an image senor wafer 610 an image sensor die 611 already having BSI layers 606 may be obtained. Accordingly, operation 804 may be omitted, and operation 831, as previously described, may be for a single die 720 having IDI layers 607. Along those lines, with additional reference to FIG. 18-5, where there is shown a block diagram illustratively depicting an example of a D2D bonding operation 832, BSI sensor dies 611 may each be coupled to a corresponding set of dies 620 through 622.

Again, image sensor die 611 may be from an image sensor wafer having a different or same diameter as wafers used for forming any or all of dies 620 through 622, such as processor die 620 for example. Again, flexibility provided by using individual dies in a D2D assemblage may be useful in reducing wastage with respect to semiconductor real estate.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

The invention claimed is:

1. An image sensor device, comprising:
an image sensor die having a first dielectric layer with a first surface, wherein the first surface extends across at least one light sensing element of the image sensor die;
a processor die having a second dielectric layer with a second surface, the second dielectric layer extending across the processor die, wherein insulating material extends along substantially an entire side surface of the processor die;
the first dielectric layer includes a first plurality of metallic pads of a first metal layer; and
the second dielectric layer includes a second plurality of metallic pads of a second metal layer; and wherein:
the first dielectric layer of the image sensor die and the second dielectric layer of the processor die are directly bonded to one another without any adhesive between the first surface and the second surface; and
at least some of the first plurality of metallic pads and the second plurality of metallic pads are directly bonded to one another for electrical connectivity.

2. The image sensor device according to claim 1, wherein the insulating material extends along all of the side surface of the processor die.

3. The image sensor device according to claim 1, wherein the insulating material comprises a molding material, and the second dielectric layer extends across the molding material.

4. The image sensor device according to claim 1, further comprising:
conductive pathways through the insulating material coupled for electrical conductivity to at least one of a plurality of metal layers of the image sensor die.

5. The image sensor device according to claim 4, wherein the conductive pathways are plated pillars or vias, the image sensor device further comprising a redistribution layer on the insulating material and interconnected to the conductive pathways for electrical communication.

6. The image sensor device of claim 1, wherein the first dielectric layer of the image sensor die and the second dielectric layer of the processor die are directly bonded with oxide-to-oxide bonding.

7. The image sensor device of claim 1, wherein the at least some of the first plurality of metallic pads and the second plurality of metallic pads are directly bonded to one another with copper-to-copper bonding.

8. The image sensor device of claim 1, wherein the insulating material comprises an epoxy.

9. The image sensor device of claim 1, wherein the insulating material comprises a coating.

10. The image sensor device of claim 1, wherein the image sensor die is a back side illuminated image sensor.

11. An image sensor device, comprising:
an image sensor die having a first dielectric layer with a first surface, wherein the first surface extends across at least one light sensing element of the image sensor die;
a processor die having a second dielectric layer with a second surface, the second dielectric layer extending across the processor die, wherein insulating material extends along substantially an entire side surface of a bulk semiconductor layer of the processor die;
the first dielectric layer includes a first plurality of metallic pads of a first metal layer; and
the second dielectric layer includes a second plurality of metallic pads of a second metal layer; and wherein:
the first dielectric layer of the image sensor die and the second dielectric layer of the processor die are directly bonded to one another without any adhesive between the first surface and the second surface; and
at least some of the first plurality of metallic pads and the second plurality of metallic pads are directly bonded to one another for electrical connectivity.

12. The image sensor device according to claim 11, wherein the insulating material extends along all of the side surface of the bulk semiconductor layer of the processor die.

13. The image sensor device according to claim 11, wherein the insulating material comprises a molding material, and the second dielectric layer extends across the molding material.

14. The image sensor device according to claim 11, further comprising:
conductive pathways through the insulating material coupled for electrical conductivity to at least one of a plurality of metal layers of the image sensor die.

15. The image sensor device according to claim 14, wherein the conductive pathways are plated pillars or vias, the image sensor device further comprising a redistribution layer on the insulating material and interconnected to the conductive pathways for electrical communication.

16. The image sensor device of claim 11, wherein the first dielectric layer of the image sensor die and the second dielectric layer of the processor die are directly bonded with oxide-to-oxide bonding.

17. The image sensor device of claim 11, wherein the at least some of the first plurality of metallic pads and the second plurality of metallic pads are directly bonded to one another with copper-to-copper bonding.

18. The image sensor device of claim 11, wherein the insulating material comprises an epoxy.

19. The image sensor device of claim 11, wherein the insulating material comprises a coating.

20. The image sensor device of claim 11, wherein the image sensor die is a back side illuminated image sensor.

21. The image sensor device according to claim 1, wherein the insulating material comprises more than one layer.

22. The image sensor device according to claim 11, wherein the insulating material comprises more than one layer.

23. An image sensor device, comprising:
an image sensor die having a first dielectric layer with a first surface, wherein the first surface extends across at least one light sensing element of the image sensor die;
a processor die having a second dielectric layer with a second surface, the second dielectric layer extending across the processor die, wherein insulating material is on side surfaces of the processor die;
the first dielectric layer including a first plurality of metallic pads of a first metal layer; and
the second dielectric layer including a second plurality of metallic pads of a second metal layer; and wherein:
the first dielectric layer of the image sensor die and the second dielectric layer of the processor die are directly bonded to one another without any adhesive between the first surface and the second surface; and
at least some of the first plurality of metallic pads and the second plurality of metallic pads are directly bonded to one another for electrical connectivity.

24. The image sensor device of claim 23, wherein the first dielectric layer of the image sensor die and the second dielectric layer of the processor die are directly bonded with oxide-to-oxide bonding.

25. The image sensor device of claim 23, wherein the at least some of the first plurality of metallic pads and the second plurality of metallic pads are directly bonded to one another with copper-to-copper bonding.

26. The image sensor device of claim 23, wherein the insulating material comprises an epoxy.

27. The image sensor device of claim 23, wherein the image sensor die is a back side illuminated image sensor.

28. The image sensor device of claim 23, wherein a diced sidewall extends from a back side of the image sensor die opposite the first surface through at least the second dielectric layer of the processor die.

29. The image sensor device of claim 23, wherein the first metal layer is one of a plurality of metal layers on a front side of the image sensor die, and wherein a conductor electrically interconnects at least one of the plurality of metal layers through a back side of the image sensor die.

* * * * *